US012244327B2

(12) United States Patent
Lee et al.

(10) Patent No.: US 12,244,327 B2
(45) Date of Patent: Mar. 4, 2025

(54) ANTENNA AND ELECTRONIC DEVICE INCLUDING SAME

(71) Applicant: Samsung Electronics Co., Ltd., Suwon-si (KR)

(72) Inventors: Yoondo Lee, Suwon-si (KR); Sigwan Kim, Suwon-si (KR); Hyelee Song, Suwon-si (KR); Dongryul Shin, Suwon-si (KR); Dongmin Shin, Suwon-si (KR); Yoonjae Lee, Suwon-si (KR); Handug Lee, Suwon-si (KR); Woosik Cho, Suwon-si (KR); Weonjai Choi, Suwon-si (KR); Taewook Ham, Suwon-si (KR); Kyunggu Kim, Suwon-si (KR); Hongpyo Bae, Suwon-si (KR); Jinwoo Jung, Suwon-si (KR); Youngjun Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/601,237

(22) Filed: Mar. 11, 2024

(65) Prior Publication Data
US 2024/0214007 A1    Jun. 27, 2024

Related U.S. Application Data

(63) Continuation of application No. 16/976,907, filed as application No. PCT/KR2020/010158 on Jul. 31, 2020, now Pat. No. 11,929,768.

(30) Foreign Application Priority Data

Aug. 6, 2019    (KR) .................. 10-2019-0095741

(51) Int. Cl.
*H01Q 1/08*    (2006.01)
*H01Q 1/24*    (2006.01)
(Continued)

(52) U.S. Cl.
CPC ............ *H04B 1/0064* (2013.01); *H01Q 1/243* (2013.01); *H01Q 5/50* (2015.01); *H01Q 21/08* (2013.01);
(Continued)

(58) Field of Classification Search
CPC ........ H04B 1/0064; H01Q 5/50; H01Q 1/243; H01Q 1/08; H05K 1/0243; H05K 1/0277; H05K 7/1427; H05K 2201/10098
See application file for complete search history.

(56) References Cited

U.S. PATENT DOCUMENTS 9,531,087 B2   12/2016   Ying
9,750,132 B2   8/2017    Kato
(Continued)

FOREIGN PATENT DOCUMENTS

CN    101360137 A    2/2009
CN    204244560 U    4/2015
(Continued)

OTHER PUBLICATIONS

IP.com (Year: 2024).*
(Continued)

*Primary Examiner* — Moustapha Diaby
(74) *Attorney, Agent, or Firm* — Jefferson IP Law, LLP

(57) ABSTRACT

In embodiments, an electronic device may include a housing having an inner space, a printed circuit board (PCB) disposed in the inner space of the housing, a first antenna structure disposed at a position spaced apart from the PCB, and transmitting and/or receiving a radio signal in a first frequency band, at least one second antenna structure disposed at a position spaced apart from the PCB, and transmitting and/or receiving a radio signal in a second frequency band different from the first frequency band, and a flexible substrate electrically connecting the PCB and the first
(Continued)

antenna structure. The flexible substrate may include a first connecting portion electrically connected to the PCB, an interconnecting portion extended from the first connecting portion to the first antenna structure, at least one branch portion branched from at least a part of the interconnecting portion, and extended to the at least one second antenna structure, at least one first conductive path disposed in the interconnecting portion, and electrically connecting the first connecting portion and the first antenna structure, and at least one second conductive path disposed in the interconnecting portion and the at least one branch portion, and electrically connecting the first connecting portion and the at least one second antenna structure.

20 Claims, 22 Drawing Sheets

(51) Int. Cl.
    *H01Q 5/50*           (2015.01)
    *H01Q 21/08*        (2006.01)
    *H04B 1/00*          (2006.01)
    *H05K 1/02*          (2006.01)
    *H05K 7/14*          (2006.01)

(52) U.S. Cl.
    CPC ......... *H05K 1/0243* (2013.01); *H05K 1/0277* (2013.01); *H05K 7/1427* (2013.01); *H05K 2201/10098* (2013.01)

(56) References Cited

U.S. PATENT DOCUMENTS

| | | | |
|---|---|---|---|
| 10,096,888 B2 | 10/2018 | Ahn et al. | |
| 10,116,346 B2 | 10/2018 | Kim et al. | |
| 10,122,401 B2 | 11/2018 | Youn et al. | |
| 10,439,267 B2 | 10/2019 | Seo et al. | |
| 2009/0061967 A1 | 3/2009 | Matsuda | |
| 2010/0240327 A1* | 9/2010 | Lambrecht | H01Q 1/243 343/702 |
| 2011/0136458 A1* | 6/2011 | Seo | H04B 7/0693 455/269 |
| 2011/0148716 A1* | 6/2011 | Sotoma | H01Q 1/243 343/700 MS |
| 2011/0298669 A1* | 12/2011 | Rao | H01Q 1/243 343/893 |
| 2012/0105287 A1* | 5/2012 | Jung | H01Q 5/15 343/702 |
| 2013/0093630 A1* | 4/2013 | Hsu | H01Q 9/42 343/702 |
| 2014/0071005 A1* | 3/2014 | Wang | H01Q 1/243 343/725 |
| 2014/0232612 A1* | 8/2014 | Jenwatanavet | H01Q 9/0421 343/893 |
| 2014/0256388 A1* | 9/2014 | Lin | H01Q 9/0421 455/575.7 |
| 2014/0266922 A1 | 9/2014 | Jin et al. | |
| 2014/0301047 A1 | 10/2014 | Kato | |
| 2017/0054200 A1 | 2/2017 | Kang et al. | |
| 2017/0141820 A1 | 5/2017 | Kim et al. | |
| 2017/0358847 A1 | 12/2017 | Cho et al. | |
| 2017/0365912 A1 | 12/2017 | Su et al. | |
| 2018/0277934 A1 | 9/2018 | Kim et al. | |
| 2018/0358686 A1 | 12/2018 | Park | |
| 2019/0081414 A1 | 3/2019 | Kao et al. | |
| 2019/0165473 A1 | 5/2019 | Yun et al. | |
| 2020/0295450 A1 | 9/2020 | Park et al. | |
| 2021/0044001 A1 | 2/2021 | Kang et al. | |

FOREIGN PATENT DOCUMENTS

| | | |
|---|---|---|
| CN | 106815627 A | 6/2017 |
| CN | 108632408 A | 10/2018 |
| CN | 109841964 A | 6/2019 |
| EP | 2 395 602 A1 | 12/2011 |
| KR | 10-2015-0064566 A | 6/2015 |
| KR | 10-2016-0139175 A | 12/2016 |
| KR | 10-2018-0108256 A | 10/2018 |
| KR | 10-2018-0134528 A | 12/2018 |
| KR | 10-2019-0050137 A | 5/2019 |
| KR | 10-2137093 B1 | 7/2020 |

OTHER PUBLICATIONS

ProQuest (Year: 2024).*
Chinese Notice of Allowance dated May 30, 2024, issued in Chinese Application No. 202080003378.0.
International Search Report dated Oct. 30, 2020, in International Application No. PCT/KR2020/010158.
Extended European Search Report dated Jul. 30, 2021, issued in European Patent Application No. 20761129.4.
European Office Action dated Apr. 26, 2023, issued in European Patent Application No. 20 761 129.4.
Korean Office Action dated Oct. 30, 2023, issued in Korean Application No. 10 2019 0095741.
Chinese Office Action dated Nov. 24, 2023, issued in Chinese Application No. 202080003378.0.

* cited by examiner

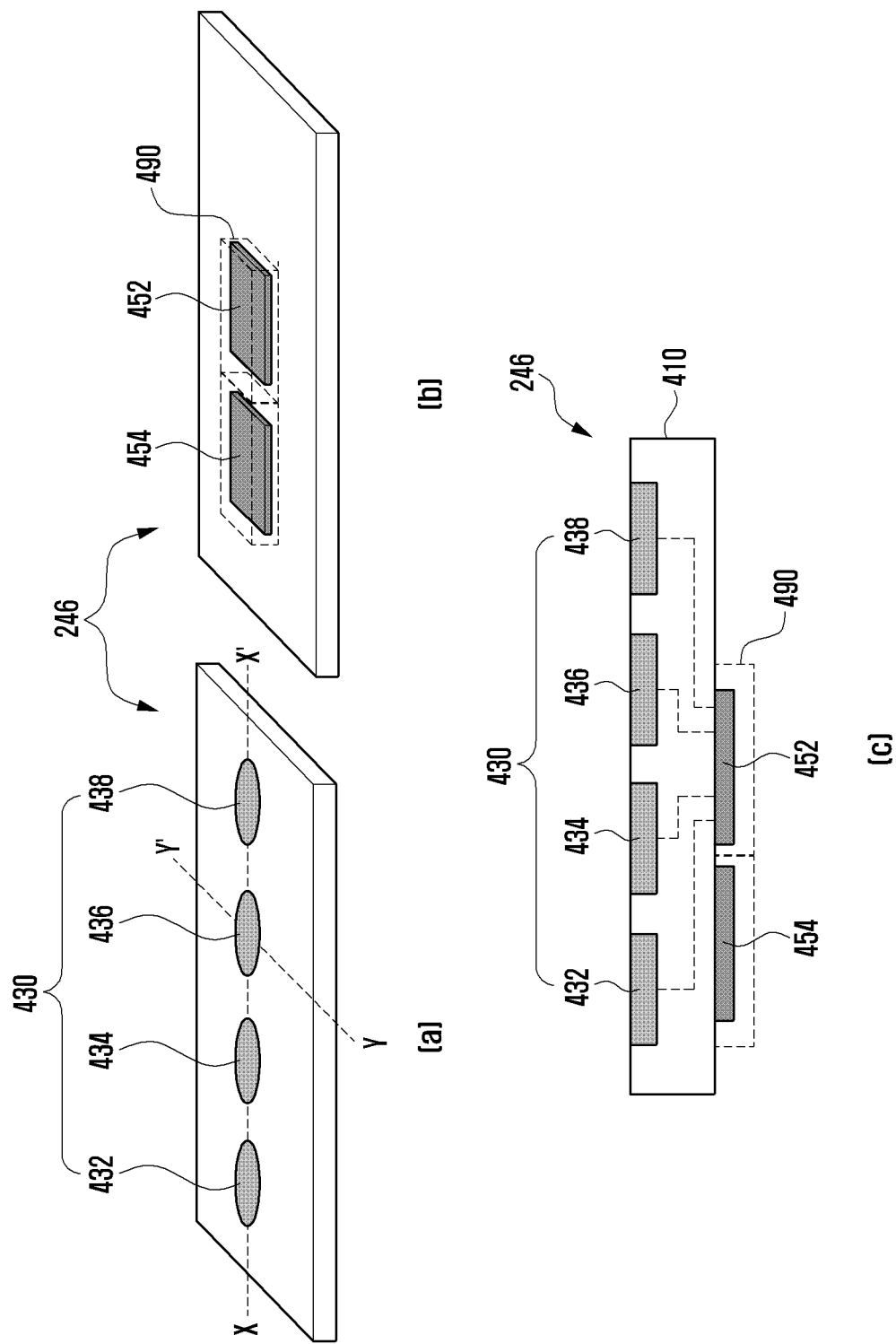

ANTENNA AND ELECTRONIC DEVICE INCLUDING SAME

CROSS-REFERENCE TO RELATED APPLICATION(S)

This application is a continuation application of prior application Ser. No. 16/976,907, filed on Aug. 31, 2020, which has issued as U.S. Pat. No. 11,929,768 on Mar. 12, 2024, which is a U.S. National Stage application under 35 U.S.C. § 371 of an International application number PCT/KR2020/010158, filed on Jul. 31, 2020, which is based on and claims priority of a Korean patent application number 10-2019-0095741, filed on Aug. 6, 2019, in the Korean Intellectual Property Office, the disclosure of which is incorporated by reference herein in its entirety.

TECHNICAL FIELD

Various embodiments provide an antenna and an electronic device including the same.

BACKGROUND ART

One of current trends in developing electronic devices to meet customer's demands is slimming a device body, that is, reducing a thickness of the electronic device. In addition, such electronic devices are being developed to increase their stiffness, strengthen their design aspects, and differentiate their functional features.

Realizing a slim electronic device needs efficiently disposing a plurality of electronic components in the inner space of the electronic device. However, if such electronic components, even though efficiently disposed, have functions not properly manifested, the quality of the electronic device may be deteriorated. Thus, the electronic device is required to meet both conditions.

DETAILED DESCRIPTION OF INVENTION

Technical Problem

According to next-generation wireless communication Portable electronic devices such as a mobile terminal, a mobile communication terminal, or a smart phone are capable of communicating with a remotely located, external electronic device through a wireless communication circuit and at least one antenna and also implementing connectivity with a nearby external device using a designated network. For example, the electronic device may have a plurality of antennas (e.g., antenna structures) so as to provide different wireless communication functions in various frequency bands.

The plurality of antennas may be disposed to be spaced apart from a printed circuit board (PCB) disposed in the inner space of the electronic device, and may be electrically connected to the PCB through an electrical connection means such as a flexible substrate.

However, as the electronic device becomes slim, a separation distance between adjacent antennas is gradually narrowing, and the radiation performance of the antennas may be deteriorated due to mutual interference.

Solution to Problem

Various embodiments of the present invention may provide an electronic device including an antenna.

Various embodiments of the present invention may provide an electronic device that includes antennas having improved radiation performance despite being disposed in the same mounting space.

According to various embodiments, an electronic device may include a housing having an inner space, a printed circuit board (PCB) disposed in the inner space of the housing, a first antenna structure disposed at a position spaced apart from the PCB, and transmitting and/or receiving a radio signal in a first frequency band, at least one second antenna structure disposed at a position spaced apart from the PCB, and transmitting and/or receiving a radio signal in a second frequency band different from the first frequency band, and a flexible substrate electrically connecting the PCB and the first antenna structure. The flexible substrate may include a first connecting portion electrically connected to the PCB, an interconnecting portion extended from the first connecting portion to the first antenna structure, at least one branch portion branched from at least a part of the interconnecting portion, and extended to the at least one second antenna structure, at least one first conductive path disposed in the interconnecting portion, and electrically connecting the first connecting portion and the first antenna structure, and at least one second conductive path disposed in the interconnecting portion and the at least one branch portion, and electrically connecting the first connecting portion and the at least one second antenna structure.

Various respective aspects and features of the invention are defined in the appended claims. Combinations of features from the dependent claims may be combined with features of the independent claims as appropriate and not merely as explicitly set out in the claims.

Furthermore, one or more selected features of any one embodiment described in this disclosure may be combined with one or more selected features of any other embodiment described herein, provided that the alternative combination of features at least partially alleviates the one or more technical problem discussed in this disclosure or at least partially alleviates a technical problem discernible by the skilled person from this disclosure and further provided that the particular combination or permutation of embodiment features thus formed would not be understood by the skilled person to be incompatible.

Two or more physically distinct components in any described example implementation of this disclosure may alternatively be integrated into a single component where possible, provided that the same function is performed by the single component thus formed. Conversely, a single component of any embodiment described in this disclosure may alternatively be implemented as two or more distinct components to achieve the same function, where appropriate.

It is an aim of certain embodiments of the invention to solve, mitigate or obviate, at least partly, at least one of the problems and/or disadvantages associated with the prior art. Certain embodiments aim to provide at least one of the advantages described below.

Advantageous Effects of Invention

An electronic device according to exemplary In the electronic device according to various embodiments of the present invention, at least some antennas are spaced apart from other antennas by using at least a portion of a flexible substrate. It is therefore possible to ensure a sufficient separation distance between adjacent antennas, improve the radiation performance of antennas, and contribute to slimming of the electronic device.

BRIEF DESCRIPTION OF DRAWINGS

The above and other aspects, features and advantages of certain embodiments of the disclosure will be more apparent from the following detailed description, taken in conjunction with the accompanying drawings.

FIG. 4A shows a structure of the third antenna module, shown in and described with reference to FIG. 2, according to various embodiments of the disclosure.

MODE FOR THE INVENTION

Figure 1:
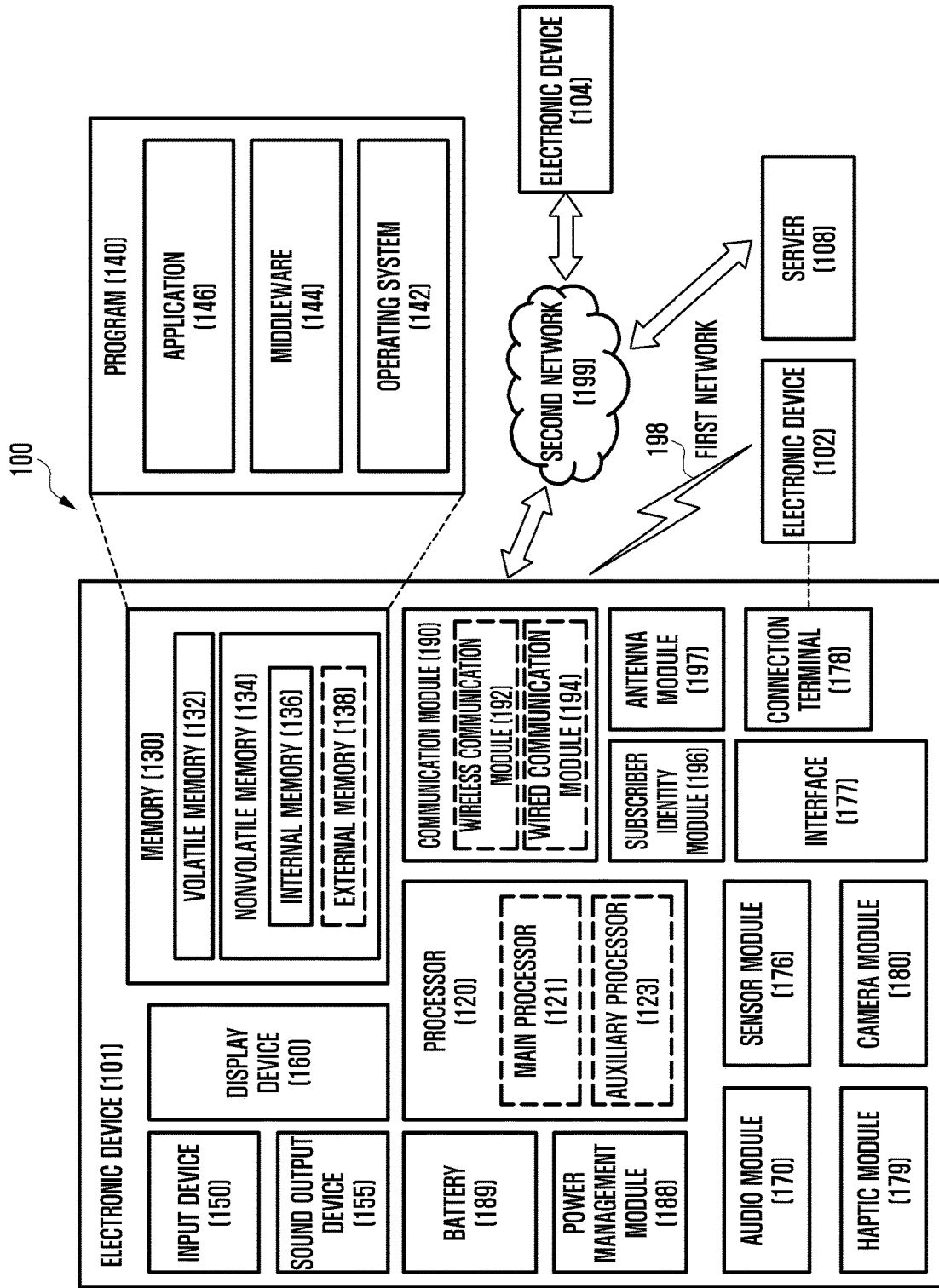
FIG. 1 is a block diagram illustrating an electronic device in a network environment according to various embodiments of the disclosure.

FIG. 1 illustrates an electronic device in a network environment according to an embodiment of the disclosure.

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). The electronic device 101 may communicate with the electronic device 104 via the server 108. The electronic device 101 includes a processor 120, memory 130, an input device 150, an audio output device 155, a display device 160, an audio module 170, a sensor module 176, an interface 177, a haptic module 179, a camera module 180, a power management module 188, a battery 189, a communication module 190, a subscriber identification module (SIM) 196, and/or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. As at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. The processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). The auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134, and the non-volatile memory may include one or more of an internal memory 136 and external memory 138.

The program 140 may be stored in the memory 130 as software, and may include, for example, an operating system (OS) 142, middleware 144, and/or an application 146.

The input device 150 may receive a command or data to be used by other components (e.g., the processor 120) of the electronic device 101, from the outside (e.g., a user) of the electronic device 101. The input device 150 may include, for example, a microphone, a mouse, a keyboard, or a digital pen (e.g., a stylus pen).

The audio output device 155 may output sound signals to the outside of the electronic device 101. The audio output device 155 may include, for example, a speaker or a receiver. The speaker may be used for general purposes, such as playing multimedia or playing record, and the receiver may be used for incoming calls. The receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. The display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input device 150, or output the sound via the audio output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. The interface 177 may include, for example, a high definition multimedia interface (HDMI), a universal serial bus (USB) interface, a secure digital (SD) card interface, or an audio interface.

A connection terminal 178 may include a connector via which the electronic device 101 may be physically connected with the external electronic device (e.g., the electronic device 102). The connection terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include, for example, a motor, a piezoelectric element, or an electric stimulator.

The camera module 180 may capture an image or moving images. The camera module 180 may include one or more lenses, image sensors, image signal processors, or flashes.

The power management module 188 may manage power supplied to the electronic device 101. The power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The antenna module 197 may transmit or receive a signal or power to or from the outside (e.g., the external electronic device) of the electronic device 101. The antenna module 197 may include an antenna including a radiating element composed of a conductive material or a conductive pattern formed in or on a substrate (e.g., a printed circuit board (PCB)). The antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. Another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the electronic devices 102 and 104 may be a device of a same type as, or a different type, from the electronic device 101. All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

An electronic device according to an embodiment may be one of various types of electronic devices. The electronic device may include a portable communication device (e.g., a smart phone), a computer device, a portable multimedia device, a portable medical device, a camera, a wearable device, or a home appliance. However, the electronic device is not limited to any of those described above.

Various embodiments of the disclosure and the terms used herein are not intended to limit the technological features set forth herein to particular embodiments and include various changes, equivalents, or replacements for a corresponding embodiment. With regard to the description of the drawings, similar reference numerals may be used to refer to similar or related elements. A singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C" may include any one of, or all possible combinations of the items enumerated together in a corresponding one of the phrases.

As used herein, such terms as "1st" and "2nd," or "first" and "second" may be used to simply distinguish a corresponding component from another, and does not limit the components in other aspect (e.g., importance or order). If an element (e.g., a first element) is referred to, with or without the term "operatively" or "communicatively," as "coupled with," "coupled to," "connected with," or "connected to" another element (e.g., a second element), it means that the element may be coupled with the other element directly (e.g., wiredly), wirelessly, or via a third element.

The term "module" may include a unit implemented in hardware, software, or firmware, and may interchangeably be used with other terms, for example, "logic," "logic block," "part," or "circuitry." A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., the internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Figure 2:
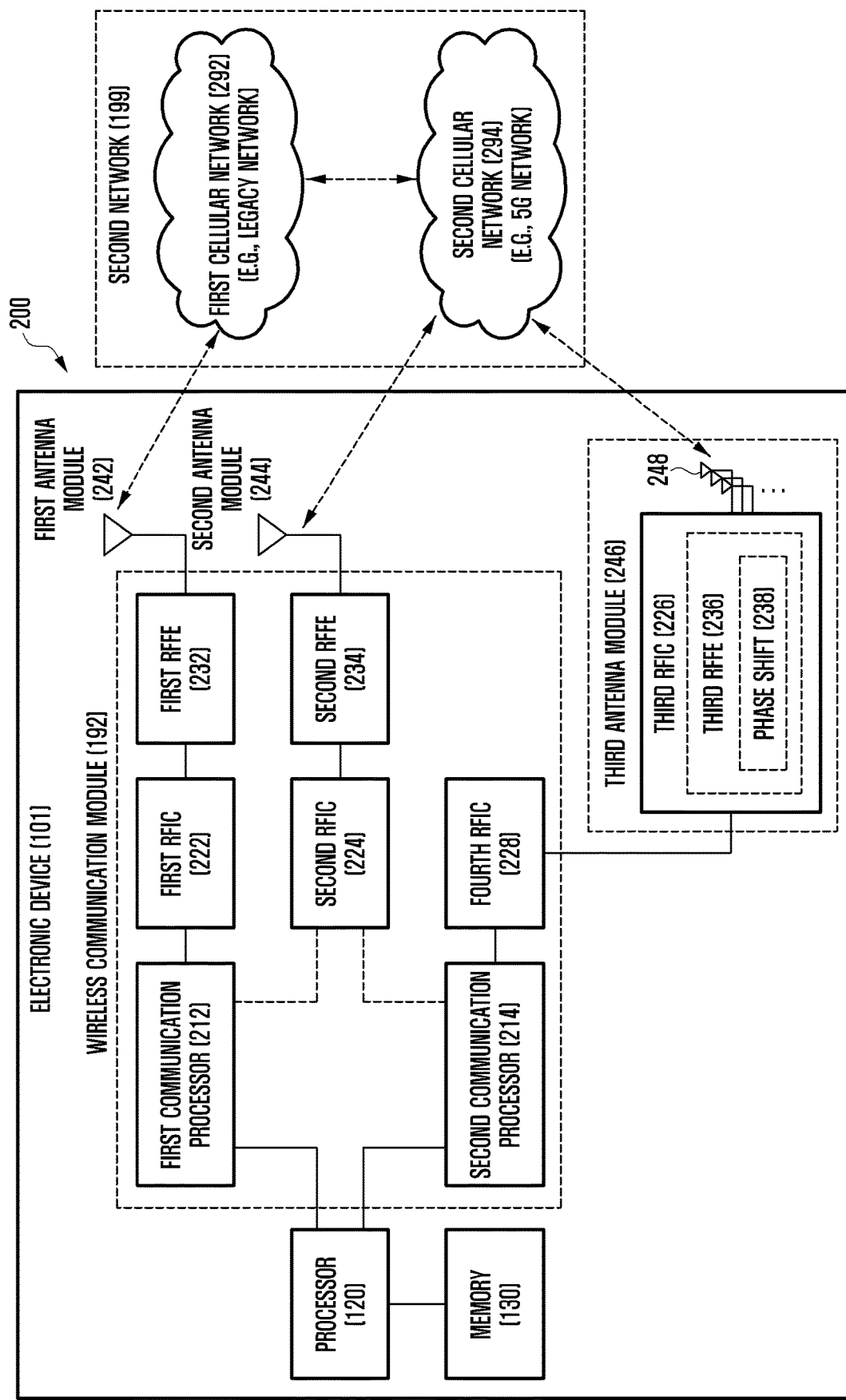
FIG. 2 is a block diagram illustrating an electronic device for supporting a legacy network communication and a 5G network communication according to various embodiments of the disclosure.

FIG. 2 is a block diagram illustrating an electronic device in a network environment including a plurality of cellular networks according to an embodiment of the disclosure.

Referring to FIG. 2, the electronic device 101 of block diagram 200 may include a first communication processor 212, second communication processor 214, first RFIC 222, second RFIC 224, third RFIC 226, fourth RFIC 228, first radio frequency front end (RFFE) 232, second RFFE 234, first antenna module 242, second antenna module 244, and antenna 248. The electronic device 101 may include the processor 120 and the memory 130. A second network 199 may include a first cellular network 292 and a second cellular network 294. According to another embodiment, the electronic device 101 may further include at least one of the components described with reference to FIG. 1, and the second network 199 may further include at least one other network. According to one embodiment, the first communication processor 212, second communication processor 214, first RFIC 222, second RFIC 224, fourth RFIC 228, first RFFE 232, and second RFFE 234 may form at least part of the wireless communication module 192. According to another embodiment, the fourth RFIC 228 may be omitted or included as part of the third RFIC 226.

The first communication processor 212 may establish a communication channel of a band to be used for wireless communication with the first cellular network 292 and support legacy network communication through the established communication channel. According to various embodiments, the first cellular network may be a legacy network including a second generation (2G), 3G, 4G, or long-term evolution (LTE) network. The second communication processor 214 may establish a communication channel corresponding to a designated band (e.g., about 6 GHz to about 60 GHz) of bands to be used for wireless communication with the second cellular network 294, and support 5G network communication through the established communication channel. According to various embodiments, the second cellular network 294 may be a 5G network defined in 3GPP. Additionally, according to an embodiment, the first communication processor 212 or the second communication processor 214 may establish a communication channel corresponding to another designated band (e.g., about 6 GHz or less) of bands to be used for wireless communication with the second cellular network 294 and support 5G network communication through the established communication channel. According to one embodiment, the first communication processor 212 and the second communication processor 214 may be implemented in a single chip or a single package. According to various embodiments, the first communication processor 212 or the second communication processor 214 may be formed in a single chip or a single package with the processor 120, the auxiliary processor 123, or the communication module 190.

Upon transmission, the first RFIC 222 may convert a baseband signal generated by the first communication processor 212 to a radio frequency (RF) signal of about 700 MHz to about 3 GHz used in the first cellular network 292 (e.g., legacy network). Upon reception, an RF signal may be obtained from the first cellular network 292 (e.g., legacy network) through an antenna (e.g., the first antenna module 242) and be preprocessed through an RFFE (e.g., the first RFFE 232). The first RFIC 222 may convert the preprocessed RF signal to a baseband signal so as to be processed by the first communication processor 212.

Upon transmission, the second RFIC 224 may convert a baseband signal generated by the first communication processor 212 or the second communication processor 214 to an RF signal (hereinafter, 5G Sub6 RF signal) of a Sub6 band (e.g., 6 GHz or less) to be used in the second cellular network 294 (e.g., 5G network). Upon reception, a 5G Sub6 RF signal may be obtained from the second cellular network 294 (e.g., 5G network) through an antenna (e.g., the second antenna module 244) and be pretreated through an RFFE (e.g., the second RFFE 234). The second RFIC 224 may convert the preprocessed 5G Sub6 RF signal to a baseband signal so as to be processed by a corresponding communication processor of the first communication processor 212 or the second communication processor 214.

The third RFIC 226 may convert a baseband signal generated by the second communication processor 214 to an RF signal (hereinafter, 5G Above6 RF signal) of a 5G Above6 band (e.g., about 6 GHz to about 60 GHz) to be used in the second cellular network 294 (e.g., 5G network). Upon reception, a 5G Above6 RF signal may be obtained from the second cellular network 294 (e.g., 5G network) through an antenna (e.g., the antenna 248) and be preprocessed through a third RFFE 236. The third RFIC 226 may convert the preprocessed 5G Above6 RF signal to a baseband signal so as to be processed by the second communication processor 214. According to one embodiment, the third RFFE 236 may be formed as part of the third RFIC 226.

According to an embodiment, the electronic device 101 may include a fourth RFIC 228 separately from the third RFIC 226 or as at least part of the third RFIC 226. In this case, the fourth RFIC 228 may convert a baseband signal generated by the second communication processor 214 to an RF signal (hereinafter, an intermediate frequency (IF) signal) of an intermediate frequency band (e.g., about 9 GHz to about 11 GHz) and transfer the IF signal to the third RFIC 226. The third RFIC 226 may convert the IF signal to a 5G Above 6RF signal. Upon reception, the 5G Above 6RF signal may be received from the second cellular network 294 (e.g., a 5G network) through an antenna (e.g., the antenna 248) and be converted to an IF signal by the third RFIC 226. The fourth RFIC 228 may convert an IF signal to a baseband signal so as to be processed by the second communication processor 214.

According to one embodiment, the first RFIC 222 and the second RFIC 224 may be implemented into at least part of a single package or a single chip. According to one embodiment, the first RFFE 232 and the second RFFE 234 may be implemented into at least part of a single package or a single chip. According to one embodiment, at least one of the first antenna module 242 or the second antenna module 244 may be omitted or may be combined with another antenna module to process RF signals of a corresponding plurality of bands.

According to one embodiment, the third RFIC 226 and the antenna 248 may be disposed at the same substrate to form a third antenna module 246. For example, the wireless communication module 192 or the processor 120 may be disposed at a first substrate (e.g., main PCB). In this case, the third RFIC 226 is disposed in a partial area (e.g., lower surface) of the first substrate and a separate second substrate (e.g., sub PCB), and the antenna 248 is disposed in another partial area (e.g., upper surface) thereof; thus, the third antenna module 246 may be formed. By disposing the third RFIC 226 and the antenna 248 in the same substrate, a length of a transmission line therebetween can be reduced. This may reduce, for example, a loss (e.g., attenuation) of a signal of a high frequency band (e.g., about 6 GHz to about 60 GHz) to be used in 5G network communication by a transmission line. Therefore, the electronic device 101 may improve a quality or speed of communication with the second cellular network 294 (e.g., 5G network).

According to one embodiment, the antenna 248 may be formed in an antenna array including a plurality of antenna elements that may be used for beamforming. In this case, the third RFIC 226 may include a plurality of phase shifters 238 corresponding to a plurality of antenna elements, for example, as part of the third RFFE 236. Upon transmission, each of the plurality of phase shifters 238 may convert a phase of a 5G Above6 RF signal to be transmitted to the outside (e.g., a base station of a 5G network) of the electronic device 101 through a corresponding antenna element. Upon reception, each of the plurality of phase shifters 238 may convert a phase of the 5G Above6 RF signal received from the outside to the same phase or substantially the same phase through a corresponding antenna element. This enables transmission or reception through beamforming between the electronic device 101 and the outside.

The second cellular network 294 (e.g., 5G network) may operate (e.g., stand-alone (SA)) independently of the first cellular network 292 (e.g., legacy network) or may be operated (e.g., non-stand alone (NSA)) in connection with the first cellular network 292. For example, the 5G network may have only an access network (e.g., 5G radio access network (RAN) or a next generation (NG) RAN and have no core network (e.g., next generation core (NGC)). In this case, after accessing to the access network of the 5G network, the electronic device 101 may access to an external network (e.g., Internet) under the control of a core network (e.g., an evolved packed core (EPC)) of the legacy network. Protocol information (e.g., LTE protocol information) for communication with a legacy network or protocol information (e.g., new radio (NR) protocol information) for communication with a 5G network may be stored in the memory 130 to be accessed by other components (e.g., the processor 120, the first communication processor 212, or the second communication processor 214).

Figure 3A:
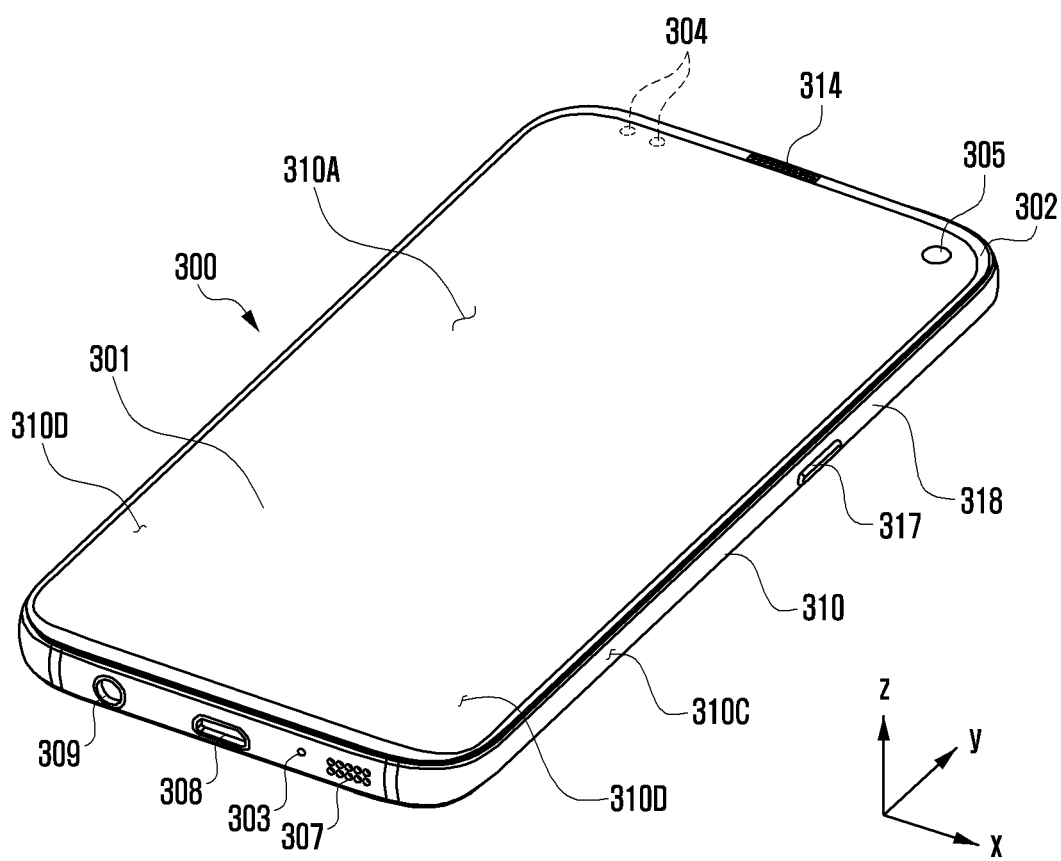
FIG. 3A is a perspective view illustrating a front surface of a mobile electronic device according to various embodiments of the disclosure.

FIG. 3A illustrates a perspective view showing a front surface of a mobile electronic device according to an embodiment of the disclosure.

Figure 3B:
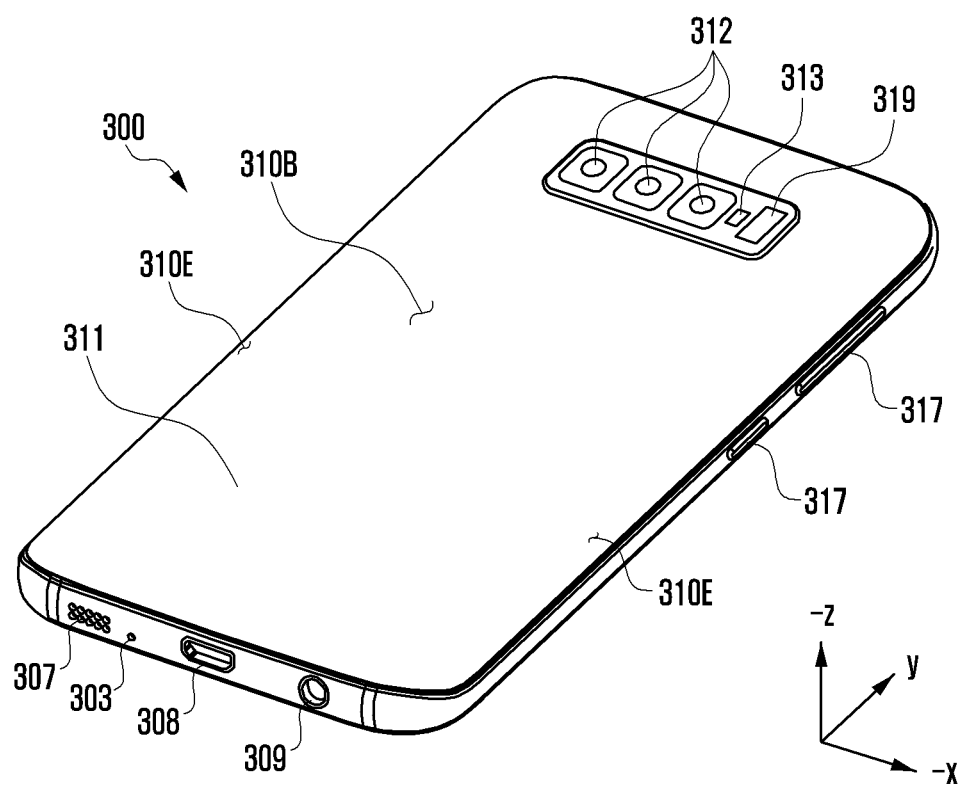
FIG. 3B is a perspective view illustrating a rear surface of a mobile electronic device according to various embodiments of the disclosure.

FIG. 3B illustrates a perspective view showing a rear surface of the mobile electronic device shown in FIG. 3A according to an embodiment of the disclosure.

Referring to FIGS. 3A and 3B, a mobile electronic device 300 may include a housing 310 that includes a first surface (or front surface) 310A, a second surface (or rear surface) 310B, and a lateral surface 310C that surrounds a space between the first surface 310A and the second surface 310B. The housing 310 may refer to a structure that forms a part of the first surface 310A, the second surface 310B, and the lateral surface 310C. The first surface 310A may be formed of a front plate 302 (e.g., a glass plate or polymer plate coated with a variety of coating layers) at least a part of which is substantially transparent. The second surface 310B may be formed of a rear plate 311 which is substantially opaque. The rear plate 311 may be formed of, for example, coated or colored glass, ceramic, polymer, metal (e.g., aluminum, stainless steel (STS), or magnesium), or any combination thereof. The lateral surface 310C may be formed of a lateral bezel structure (or "lateral member") 318 which is combined with the front plate 302 and the rear plate 311 and includes a metal and/or polymer. The rear plate 311 and the lateral bezel structure 318 may be integrally formed and may be of the same material (e.g., a metallic material such as aluminum).

The front plate 302 may include two first regions 310D disposed at long edges thereof, respectively, and bent and extended seamlessly from the first surface 310A toward the rear plate 311. Similarly, the rear plate 311 may include two second regions 310E disposed at long edges thereof, respectively, and bent and extended seamlessly from the second surface 310B toward the front plate 302. The front plate 302 (or the rear plate 311) may include only one of the first regions 310D (or of the second regions 310E). The first regions 310D or the second regions 310E may be omitted in part. When viewed from a lateral side of the mobile electronic device 300, the lateral bezel structure 318 may have a first thickness (or width) on a lateral side where the first region 310D or the second region 310E is not included, and may have a second thickness, being less than the first thickness, on another lateral side where the first region 310D or the second region 310E is included.

The mobile electronic device 300 may include at least one of a display 301, audio modules 303, 307 and 314, sensor modules 304 and 319, camera modules 305, 312 and 313, a key input device 317, a light emitting device, and connector holes 308 and 309. The mobile electronic device 300 may omit at least one (e.g., the key input device 317 or the light emitting device) of the above components, or may further include other components.

The display 301 may be exposed through a substantial portion of the front plate 302, for example. At least a part of the display 301 may be exposed through the front plate 302 that forms the first surface 310A and the first region 310D of the lateral surface 310C. Outlines (i.e., edges and corners) of the display 301 may have substantially the same form as those of the front plate 302. The spacing between the outline of the display 301 and the outline of the front plate 302 may be substantially unchanged in order to enlarge the exposed area of the display 301.

A recess or opening may be formed in a portion of a display area of the display 301 to accommodate at least one of the audio module 314, the sensor module 304, the camera module 305, and the light emitting device. At least one of the audio module 314, the sensor module 304, the camera module 305, a fingerprint sensor (not shown), and the light emitting element may be disposed on the back of the display area of the display 301. The display 301 may be combined with, or adjacent to, a touch sensing circuit, a pressure sensor capable of measuring the touch strength (pressure), and/or a digitizer for detecting a stylus pen. At least a part of the sensor modules 304 and 319 and/or at least a part of the key input device 317 may be disposed in the first region 310D and/or the second region 310E. The audio modules 303, 307 and 314 may correspond to a microphone hole 303 and speaker holes 307 and 314, respectively. The microphone hole 303 may contain a microphone disposed therein for acquiring external sounds and, in a case, contain a plurality of microphones to sense a sound direction. The speaker holes 307 and 314 may be classified into an external speaker hole 307 and a call receiver hole 314. The microphone hole 303 and the speaker holes 307 and 314 may be implemented as a single hole, or a speaker (e.g., a piezo speaker) may be provided without the speaker holes 307 and 314.

The sensor modules 304 and 319 may generate electrical signals or data corresponding to an internal operating state of the mobile electronic device 300 or to an external environmental condition. The sensor modules 304 and 319 may include a first sensor module 304 (e.g., a proximity sensor) and/or a second sensor module (e.g., a fingerprint sensor) disposed on the first surface 310A of the housing 310, and/or a third sensor module 319 (e.g., a heart rate monitor (HRM) sensor) and/or a fourth sensor module (e.g., a fingerprint sensor) disposed on the second surface 310B of the housing 310. The fingerprint sensor may be disposed on the second surface 310B as well as the first surface 310A (e.g., the display 301) of the housing 310. The electronic device 300 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 305, 312 and 313 may include a first camera device 305 disposed on the first surface 310A of the electronic device 300, and a second camera module 312 and/or a flash 313 disposed on the second surface 310B. The camera module 305 or the camera module 312 may include one or more lenses, an image sensor, and/or an image signal processor. The flash 313 may include, for example, a light emitting diode or a xenon lamp. Two or more lenses (infrared cameras, wide angle and telephoto lenses) and image sensors may be disposed on one side of the electronic device 300.

The key input device 317 may be disposed on the lateral surface 310C of the housing 310. The mobile electronic device 300 may not include some or all of the key input device 317 described above, and the key input device 317 which is not included may be implemented in another form such as a soft key on the display 301. The key input device 317 may include the sensor module disposed on the second surface 310B of the housing 310.

The light emitting device may be disposed on the first surface 310A of the housing 310. For example, the light emitting device may provide status information of the electronic device 300 in an optical form. The light emitting device may provide a light source associated with the operation of the camera module 305. The light emitting device may include, for example, a light emitting diode (LED), an IR LED, or a xenon lamp.

The connector holes 308 and 309 may include a first connector hole 308 adapted for a connector (e.g., a universal serial bus (USB) connector) for transmitting and receiving power and/or data to and from an external electronic device, and/or a second connector hole 309 adapted for a connector (e.g., an earphone jack) for transmitting and receiving an audio signal to and from an external electronic device.

Some modules 305 of camera modules 305 and 312, some sensor modules 304 of sensor modules 304 and 319, or an indicator may be arranged to be exposed through a display 301. For example, the camera module 305, the sensor module 304, or the indicator may be arranged in the internal space of an electronic device 300 so as to be brought into contact with an external environment through an opening of the display 301, which is perforated up to a front plate 302. In another embodiment, some sensor modules 304 may be arranged to perform their functions without being visually exposed through the front plate 302 in the internal space of the electronic device. For example, in this case, an area of the display 301 facing the sensor module may not require a perforated opening.

Figure 3C:
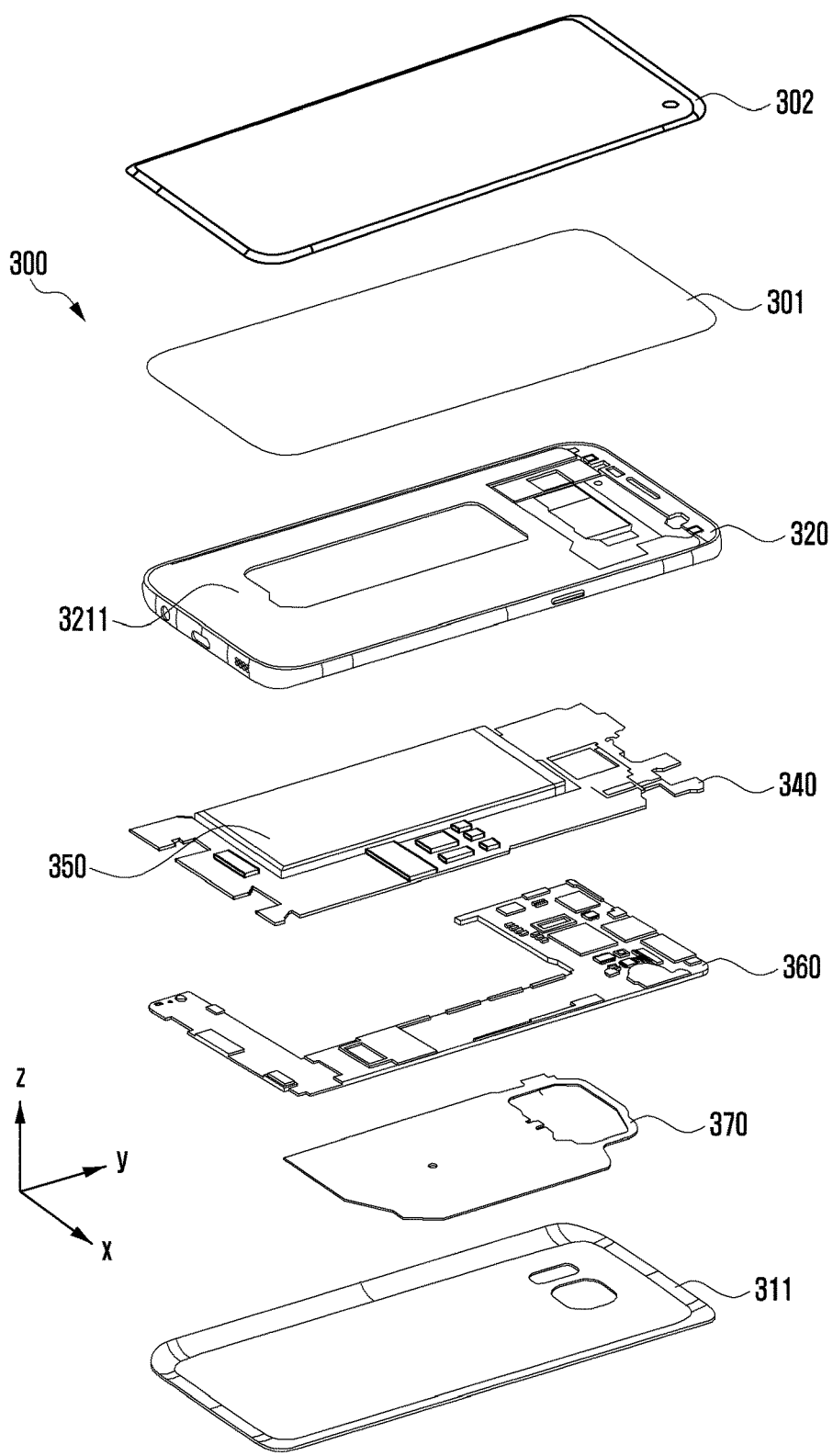
FIG. 3C is an exploded perspective view illustrating a mobile electronic device according to various embodiments of the disclosure.

FIG. 3C illustrates an exploded perspective view showing a mobile electronic device shown in FIG. 3A according to an embodiment of the disclosure.

Referring to FIG. 3C, the mobile electronic device 300 may include a lateral bezel structure 320, a first support member 3211 (e.g., a bracket), the front plate 302, the display 301, an electromagnetic induction panel (not shown), a printed circuit board (PCB) 340, a battery 350, a second support member 360 (e.g., a rear case), an antenna 370, and a rear plate 311. The mobile electronic device 300 may omit at least one (e.g., the first support member 3211 or the second support member 360) of the above components or may further include another component. Some components of the electronic device 300 may be the same as or similar to those of the mobile electronic device 101 shown in FIG. 1 or FIG. 2, thus, descriptions thereof are omitted below.

The first support member 3211 is disposed inside the mobile electronic device 300 and may be connected to, or integrated with, the lateral bezel structure 320. The first support member 3211 may be formed of, for example, a metallic material and/or a non-metal (e.g., polymer) material. The first support member 3211 may be combined with the display 301 at one side thereof and also combined with the printed circuit board (PCB) 340 at the other side thereof. On the PCB 340, a processor, a memory, and/or an interface may be mounted. The processor may include, for example, one or more of a central processing unit (CPU), an application processor (AP), a graphics processing unit (GPU), an image signal processor (ISP), a sensor hub processor, or a communications processor (CP).

The memory may include, for example, one or more of a volatile memory and a non-volatile memory.

The interface may include, for example, a high definition multimedia interface (HDMI), a USB interface, a secure digital (SD) card interface, and/or an audio interface. The interface may electrically or physically connect the mobile electronic device 300 with an external electronic device and may include a USB connector, an SD card/multimedia card (MMC) connector, or an audio connector.

The battery 350 is a device for supplying power to at least one component of the mobile electronic device 300, and may include, for example, a non-rechargeable primary battery, a rechargeable secondary battery, or a fuel cell. At least a part of the battery 350 may be disposed on substantially the same plane as the PCB 340. The battery 350 may be integrally disposed within the mobile electronic device 300, and may be detachably disposed from the mobile electronic device 300.

The antenna 370 may be disposed between the rear plate 311 and the battery 350. The antenna 370 may include, for example, a near field communication (NFC) antenna, a wireless charging antenna, and/or a magnetic secure transmission (MST) antenna. The antenna 370 may perform short-range communication with an external device, or transmit and receive power required for charging wirelessly. An antenna structure may be formed by a part or combination of the lateral bezel structure 320 and/or the first support member 3211.

FIG. 4A is a diagram illustrating a structure of, for example, a third antenna module described with reference to FIG. 2 according to an embodiment of the disclosure. Referring to FIG. 4A, view (a) is a perspective view illustrating the third antenna module 246 viewed from one side, and FIG. 4A, view (b) is a perspective view illustrating the third antenna module 246 viewed from the other side. FIG. 4A, view (c) is a cross-sectional view illustrating the third antenna module 246 taken along line X-X' of FIG. 4A.

With reference to FIG. 4A, in one embodiment, the third antenna module 246 may include a printed circuit board 410, an antenna array 430, an RFIC 452, and a PMIC 454. Alternatively, the third antenna module 246 may further include a shield member 490. In other embodiments, at least one of the above-described components may be omitted or at least two of the components may be integrally formed.

The printed circuit board 410 may include a plurality of conductive layers and a plurality of non-conductive layers stacked alternately with the conductive layers. The printed circuit board 410 may provide electrical connections between the printed circuit board 410 and/or various electronic components disposed outside using wirings and conductive vias formed in the conductive layer.

The antenna array 430 (e.g., 248 of FIG. 2) may include a plurality of antenna elements 432, 434, 436, and/or 438 disposed to form a directional beam. As illustrated, the antenna elements 432, 434, 436, and/or 438 may be formed at a first surface of the printed circuit board 410. According to another embodiment, the antenna array 430 may be formed inside the printed circuit board 410. According to the embodiment, the antenna array 430 may include the same or a different shape or kind of a plurality of antenna arrays (e.g., dipole antenna array and/or patch antenna array).

The RFIC 452 (e.g., the third RFIC 226 of FIG. 2) may be disposed at another area (e.g., a second surface opposite to the first surface) of the printed circuit board 410 spaced apart from the antenna array. The RFIC 452 is configured to process signals of a selected frequency band transmitted/received through the antenna array 430. According to one embodiment, upon transmission, the RFIC 452 may convert a baseband signal obtained from a communication processor (not shown) to an RF signal of a designated band. Upon reception, the RFIC 452 may convert an RF signal received through the antenna array 430 to a baseband signal and transfer the baseband signal to the communication processor.

According to another embodiment, upon transmission, the RFIC 452 may up-convert an IF signal (e.g., about 9 GHz to about 11 GHz) obtained from an intermediate frequency integrate circuit (IFIC) (e.g., 228 of FIG. 2) to an RF signal of a selected band. Upon reception, the RFIC 452 may down-convert the RF signal obtained through the antenna array 430, convert the RF signal to an IF signal, and transfer the IF signal to the IFIC.

The PMIC 454 may be disposed in another partial area (e.g., the second surface) of the printed circuit board 410 spaced apart from the antenna array 430. The PMIC 454 may receive a voltage from a main PCB (not illustrated) to provide power necessary for various components (e.g., the RFIC 452) on the antenna module.

The shielding member 490 may be disposed at a portion (e.g., the second surface) of the printed circuit board 410 so as to electromagnetically shield at least one of the RFIC 452 or the PMIC 454. According to one embodiment, the shield member 490 may include a shield can.

Although not shown, in various embodiments, the third antenna module 246 may be electrically connected to another printed circuit board (e.g., main circuit board) through a module interface. The module interface may include a connecting member, for example, a coaxial cable connector, board to board connector, interposer, or flexible printed circuit board (FPCB). The RFIC 452 and/or the PMIC 454 of the antenna module may be electrically connected to the printed circuit board through the connection member.

Figure 4B:
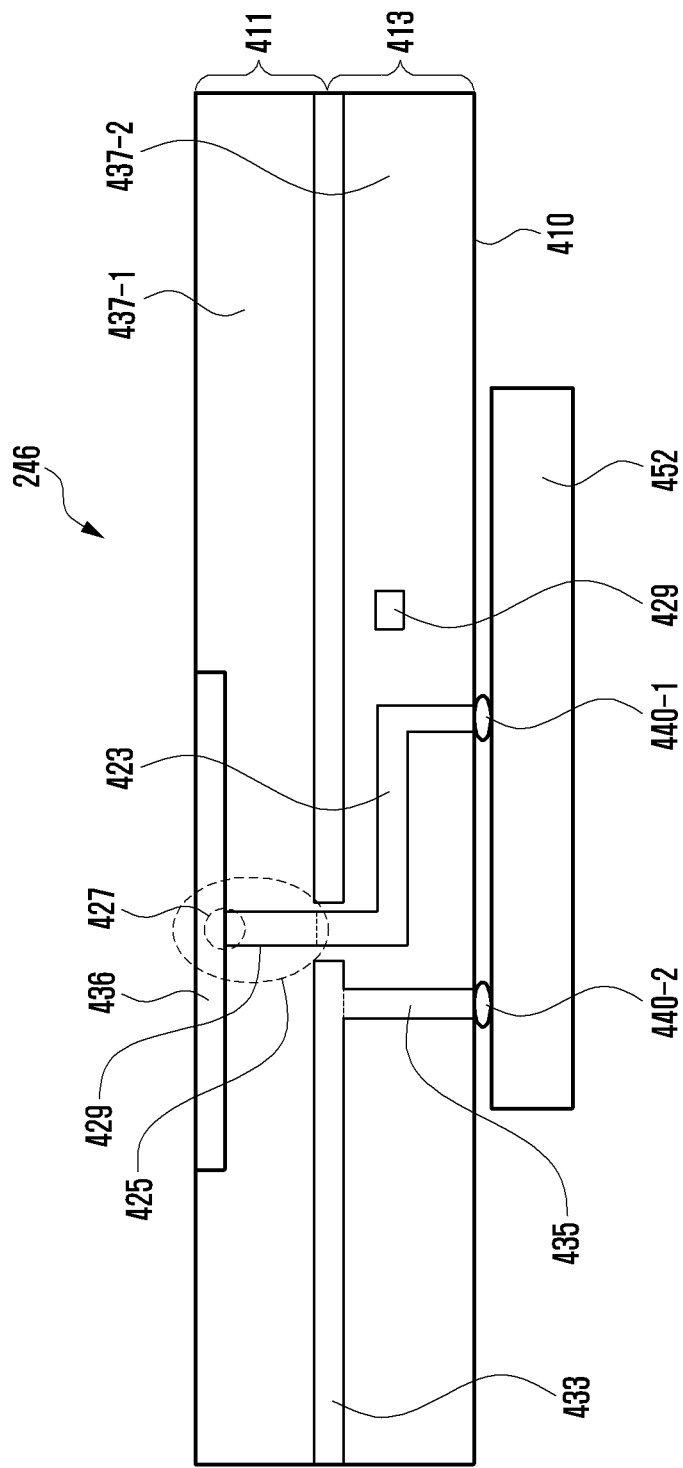
FIG. 4B is a cross-sectional view, taken along the line Y-Y' in FIG. 4A, illustrating the third antenna module, shown in and described with reference to FIG. 4A, according to various embodiments of the disclosure.

FIG. 4B is a cross-sectional view illustrating the third antenna module 246 taken along line Y-Y' of FIG. 4A, view (a) according to an embodiment of the disclosure.

Referring to FIG. 4B, the printed circuit board 410 of the illustrated embodiment may include an antenna layer 411 and a network layer 413. The antenna layer 411 may include at least one dielectric layer 437-1, and an antenna element 436 and/or a power feeding portion 425 formed on or inside an outer surface of a dielectric layer. The power feeding portion 425 may include a power feeding point 427 and/or a power feeding line 429.

The network layer 413 may include at least one dielectric layer 437-2, at least one ground layer 433, at least one conductive via 435, a transmission line 423, and/or a power feeding line 429 formed on or inside an outer surface of the dielectric layer.

Further, in the illustrated embodiment, the RFIC 452 (e.g., the third RFIC 226 of FIG. 2) of FIG. 4A, view (c) may be electrically connected to the network layer 413 through, for example, first and second solder bumps 440-1 and 440-2. In other embodiments, various connection structures (e.g., solder or ball grid array (BGA)) instead of the solder bumps may be used. The RFIC 452 may be electrically connected to the antenna element 436 through the first solder bump 440-1, the transmission line 423, and the power feeding portion 425. The RFIC 452 may also be electrically connected to the ground layer 433 through the second solder bump 440-2 and the conductive via 435. Although not illustrated, the RFIC 452 may also be electrically connected to the above-described module interface through the power feeding line 429.

Figure 5:
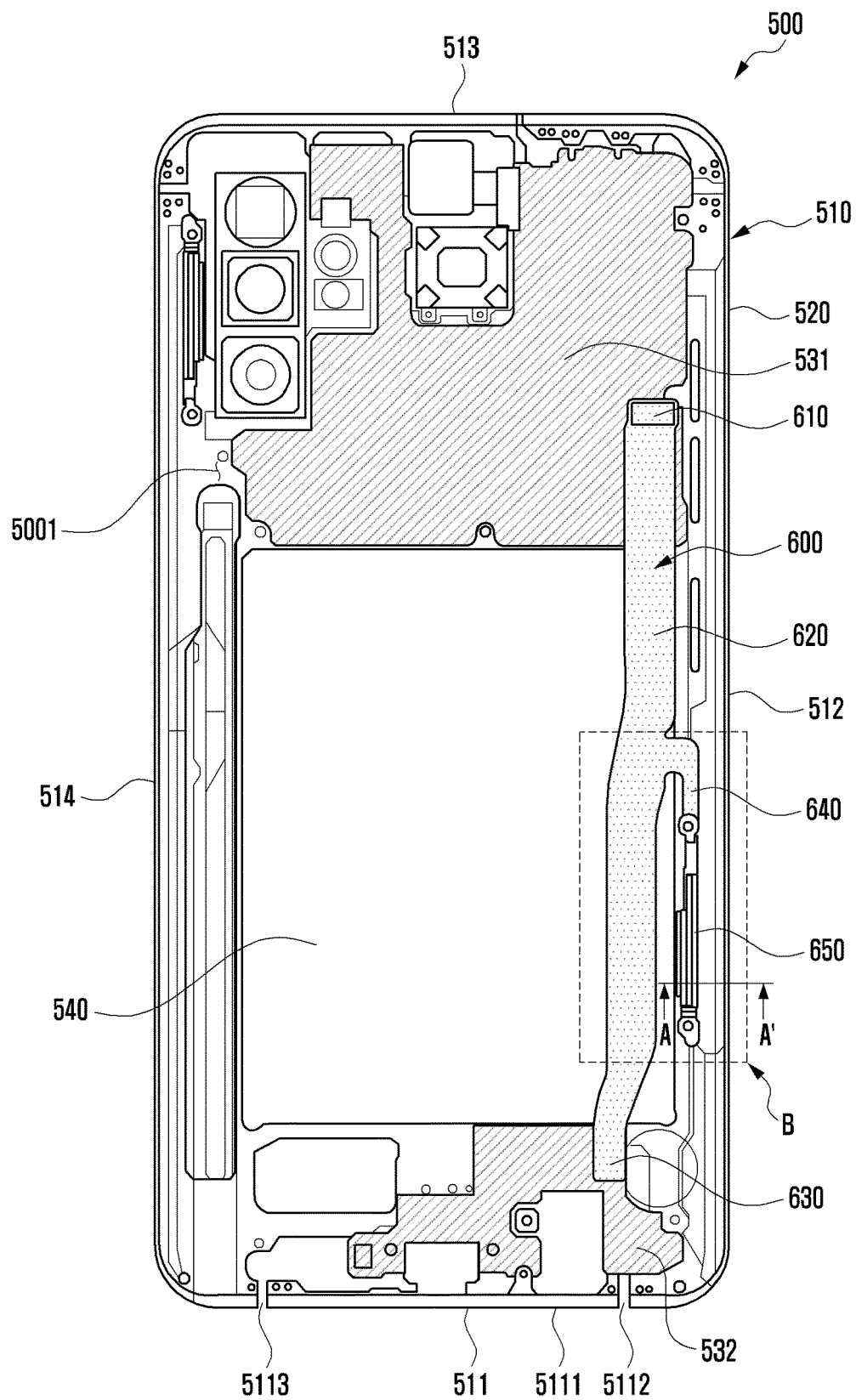
FIG. 5 is a plan view illustrating an internal configuration of an electronic device including a flexible substrate according to various embodiments of the disclosure.

FIG. 5 is a plan view illustrating an internal configuration of an electronic device 500 including a flexible substrate 600 according to various embodiments of the disclosure. FIG. 5 shows the internal configuration of the electronic device 500 from which a rear cover (e.g., the rear cover 503 in FIG. 7) is removed.

The electronic device 500 shown in FIG. 5 may be similar, at least in part, to the electronic device 101 shown in FIG. 1 or the electronic device 300 shown in FIG. 3A, or may include other embodiments of the electronic device.

Referring to FIG. 5, the electronic device 500 may include a housing 510 (e.g., a housing structure) that includes a front cover (e.g., the front cover 502 in FIG. 7, also referred to as a first cover, a first plate, a front plate, or a transparent cover), a rear cover (e.g., the rear cover 503 in FIG. 7, also referred to as a second cover, a second plate, or a rear plate) facing in the opposite direction to the front cover 502, and a lateral member 520 surrounding an inner space 5001 between the front and rear covers 502 and 503. According to an embodiment, the lateral member 520 may include, at least in part, a conductive member (e.g., the conductive member 521 in FIG. 7). According to an embodiment, the lateral member 520 may include a first lateral surface 511 having a first length, a second lateral surface 512 extended perpendicularly from the first lateral surface 511 and having a second length greater than the first length, a third lateral surface 513 extended from the second lateral surface 512 in parallel with the first lateral surface 511 and having the first length, and a fourth lateral surface 514 extended from the third lateral surface 513 in parallel with the second lateral surface 512 and having the second length. According to an embodiment, the electronic device 500 may include at least one first antenna structure 5111 formed through the first lateral surface 511 of the lateral member 520. According to an embodiment, the first antenna structure 5111 may include a conductive portion 5111 (e.g., a radiation means or an antenna element) electrically isolated through non-conductive portions 5112 and 5113 (e.g., polymer) spaced apart from each other in the first lateral surface 511 of the lateral member 520. According to an embodiment, the first antenna structure 5111 may be electrically connected to a wireless communication circuit (e.g., the wireless communication module 192 in FIG. 1) mounted on a first printed circuit board (PCB) 531 (e.g., a rigid PCB or a flexible substrate such as a flexible PCB (FPCB)). According to an embodiment, near the non-conductive portions 5112 and 5113, a part of the second lateral surface 512 and/or a part of the fourth lateral surface 514 may also be electrically connected to the wireless communication circuit (e.g., the wireless communication module 192 in FIG. 1) and thereby used as a part (e.g., at least one other radiation means or antenna element) of the at least one first antenna structure. In another embodiment, the first antenna structure 5111 may be replaced by, or may further include, a radiation means such as a conductive pattern patterned on a second printed circuit board 532 (e.g., a rigid PCB or a flexible substrate such as a FPCB). In still another embodiment, the first antenna structure 5111 may be replaced by, or may further include, a laser direct structuring (LDS) pattern formed on an antenna carrier as a dielectric structure in the inner space 5001 of the electronic device 500.

According to various embodiments, the electronic device 500 may include a first PCB 531 (also referred to as a main substrate or a first device substrate) disposed in the inner space 5001, and a second PCB 532 (also referred to as a sub-substrate or a second device substrate) disposed in the inner space 5001 and spaced apart from the first PCB 531. According to an embodiment, the first PCB 531 may include at least one wireless communication circuit (e.g., the wireless communication module 192 in FIG. 1). According to an embodiment, the first PCB 531 may be disposed in a region (e.g., an upper region of the electronic device 500 or near the third lateral surface 513) where electronic components (e.g., at least one camera module, at least one sensor module, and/or a speaker module) are crowded in the inner space 5001 of the electronic device 500. According to an embodiment, the second PCB 532 may be disposed in a region (e.g., a lower region of the electronic device 500 or near the first lateral surface 511) spaced apart from the first PCB 531 in order to be electrically connected to the conductive portion 5111 used as the at least one first antenna structure 5111. According to an embodiment, the electronic device 500 may include a battery 540 disposed between the first PCB 531 and the second PCB 532. According to an embodiment, the battery 540 may be disposed so as not to be overlapped with the first PCB 531 and/or the second PCB 532. In another embodiment, the battery 540 may be disposed to be overlapped, at least in part, with the first PCB 531 and/or the second PCB 532.

According to various embodiments, the electronic device 500 may include a flexible substrate 600 (e.g., a flexible PCB type radio frequency cable (FPCB type RF cable; FRC)) as an electrical connection means disposed to electrically connect the first PCB 531 and the second PCB 532. According to an embodiment, at least a portion of the flexible substrate 600 may be disposed to be overlapped at least in part with the battery 540. According to an embodiment, the wireless communication circuit (e.g., the wireless communication module 192 in FIG. 1) mounted on the first PCB 531 may be electrically connected to the first antenna structure 5111 (e.g., the conductive portion 5111) through the flexible substrate 600 and the second PCB 532.

According to various embodiments, the flexible substrate 600 may include a first connecting portion 610 electrically connected to the first PCB 531, an interconnecting portion 620 extended from the first connecting portion 610 with a certain length, and a second connecting portion 630 extended from the interconnecting portion 620 and electrically connected to the second PCB 532. According to an embodiment, unlike a coaxial RF cable, the flexible substrate 600 may be formed of a polymer material, such as polyimide, that is resistant to bending and easy to expand its function. In another embodiment, the second connecting portion 630 of the flexible substrate 600 may be directly electrically connected to the first antenna structure 5111 without the second PCB 532. According to an embodiment, the flexible substrate 600 may include a branch portion 640 that is branched from the interconnecting portion 620. The branch portion 640 may be electrically connected to a second antenna structure 650 disposed in the inner space of the electronic device 500. According to an embodiment, the second antenna structure 650 may be disposed at a position close to the second lateral surface 512 of the lateral member 520 through a suitable design of the branch portion 640. According to an embodiment, the second antenna structure 650 may be fixed to a part of the second lateral surface 512 through a structural modification of the second lateral surface 512. According to an embodiment, the first connecting portion 610 and/or the second connecting portion 630 may include an electrical connectors as an electrical connection means engaged with a receptacle mounted on the first PCB 531 and/or the second PCB 532. According to another embodiment, the first connecting portion 610 and/or the second connecting portion 630 may include conductive terminals that are soldered or conductively bonded to conductive pads formed on the first PCB 531 and/or the second PCB 532 through conductive bonding means (e.g., solder or conductive adhesive).

According to various embodiments, the second antenna structure 650 is disposed at a position sufficiently spaced apart from the first antenna structure 5111 through the flexible substrate 600. This can contribute to improving the radiation performance of the antenna.

Figure 6A:
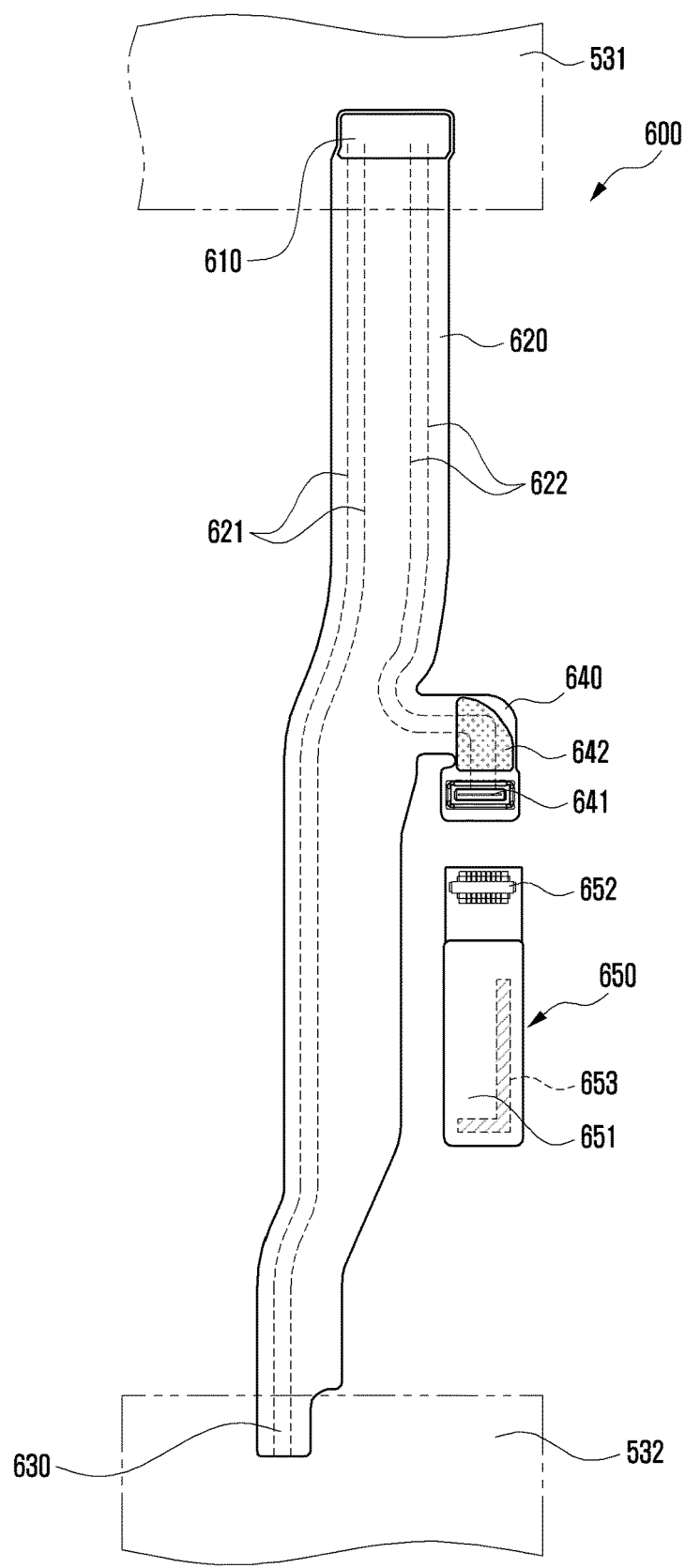
FIG. 6A is a schematic view illustrating a configuration of a flexible substrate including a second antenna structure according to various embodiments of the disclosure.

FIG. 6A is a schematic view illustrating a configuration of a flexible substrate 600 including a second antenna structure 650 according to various embodiments of the disclosure.

Referring to FIG. 6A, the flexible substrate 600 may include at least one first conductive path 621 extended from the first connecting portion 610 to the second connecting portion 630 through the interconnecting portion 620. For example, the number of at least one first conductive path 621 may be proportional to the number of at least one antenna element (e.g., the conductive portion 5111) of the first antenna structure 5111. According to an embodiment, the at least one wireless communication circuit (e.g., the wireless communication module 192 in FIG. 1) mounted on the first PCB 531 may be electrically connected to at least one first antenna structure (e.g., the first antenna structure 5111 in FIG. 5) through the at least one first conductive path 621. According to an embodiment, the at least one wireless communication circuit (e.g., the wireless communication module 192 in FIG. 1) may be configured to transmit and/or receive a radio signal in a first frequency band through the at least one first antenna structure 5111. For example, the first frequency band may include a range of about 800 MHz to about 3300 MHz.

According to various embodiments, the flexible substrate 600 may include at least one second conductive path 622 extended from the first connecting portion 610 through the interconnecting portion 620 and the branch portion 640 and electrically connected to the at least one second antenna structure 650. According to an embodiment, the at least one wireless communication circuit (e.g., the wireless communication module 192 in FIG. 1) may be configured to transmit and/or receive a radio signal in a second frequency band, different from the first frequency band, through the second antenna structure 650. For example, the second frequency band may include a range of about 3.3 GHz to about 6.0 GHz. In another embodiment, the second frequency band may include a range of about 3 GHz to about 300 GHz. In this case, the wireless communication circuit electrically connected to the first antenna structure 5111 and the wireless communication circuit electrically connected to the second antenna structure 650 may be different.

According to various embodiments, the branch portion 640 may include a ground region 642 that is at least partially exposed. According to an embodiment, when the branch 640 is disposed in the lateral member 520, the ground region 642 may be electrically connected to the conductive member (e.g., the conductive member 521 in FIG. 7) formed as at least a part of the lateral member 520.

According to various embodiments, the second antenna structure 650 may include a dielectric substrate 651, at least one first antenna element 653 disposed on/in the dielectric substrate 651, and/or an electrical connector 652 electrically connected to a receptacle 641 disposed at an end of the branch portion 640. According to an embodiment, the second antenna structure 650 may be configured to be combined with or separated from the branch portion 640 of the flexible substrate 600 through a fastening structure between the electrical connector 652 and the receptacle 641. This allows the second antenna structure 650 to be easily replaced for a frequency design change, or maintained. In another embodiment, the second antenna structure 650 may be combined with the branch portion 640 through soldering or conductive bonding between conductive terminals, formed on the dielectric substrate 651 and electrically connected to the first antenna element 653, and conductive pads disposed on the branch portion 640.

Figure 6B:
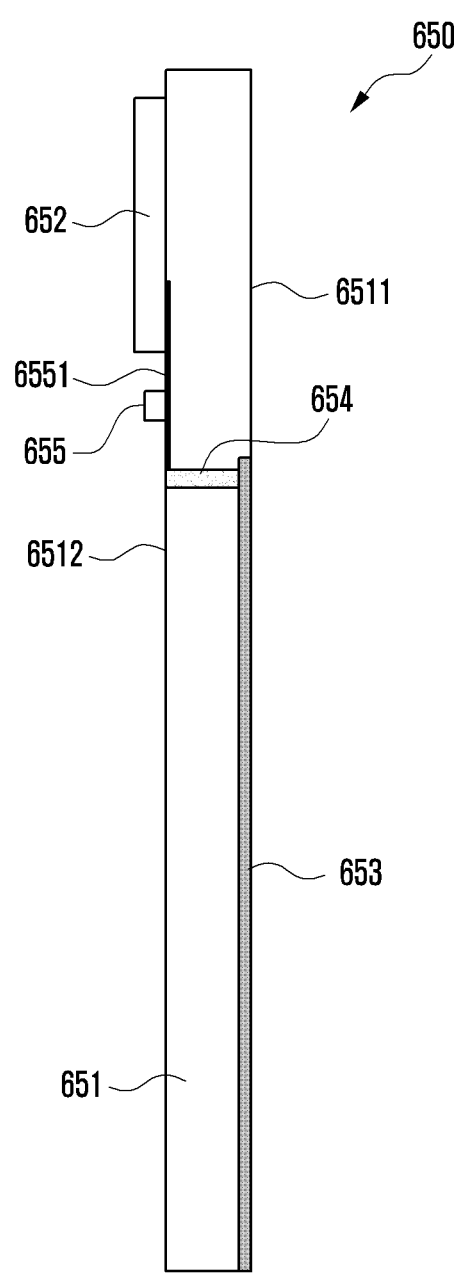
FIG. 6B is a cross-sectional view illustrating a configuration of a second antenna structure according to various embodiments of the disclosure.

FIG. 6B is a cross-sectional view illustrating a configuration of a second antenna structure 650 according to various embodiments of the disclosure.

Referring to FIG. 6B, the second antenna structure 650 may include the dielectric substrate 651 that has a first substrate surface 6511 and a second substrate surface 6512 facing opposite to the first substrate surface 6511. According to an embodiment, the second antenna structure 650 may include the at least one first antenna element 653, as a radiation means, exposed to the first substrate surface 6511 of the dielectric substrate 651 or disposed near the first substrate surface 6511 in an inner space of the dielectric substrate 651. According to an embodiment, the at least one first antenna element 653 may include at least one conductive pattern and/or at least one conductive patch formed on/in the dielectric substrate 651. According to an embodiment, the second antenna structure 650 may include the electrical connector 652 mounted on the second substrate surface 6512 of the dielectric substrate 651 and to be connected to the receptacle mounted on the branch portion 640 of the flexible substrate 600. According to an embodiment, the first antenna element 653 may be electrically connected to the electrical connector 652 through at least one conductive via 654 formed from the first substrate surface 6511 to the second substrate surface 6512 and through an electrical wiring 6651 formed on the second substrate surface 6512 to connect the at least one conductive via 654 and the electrical connector 652. According to an embodiment, the second antenna structure 650 may include at least one matching circuit 655, as an impedance matching means, mounted on the electrical wiring 6651 for impedance matching.

Figure 7:
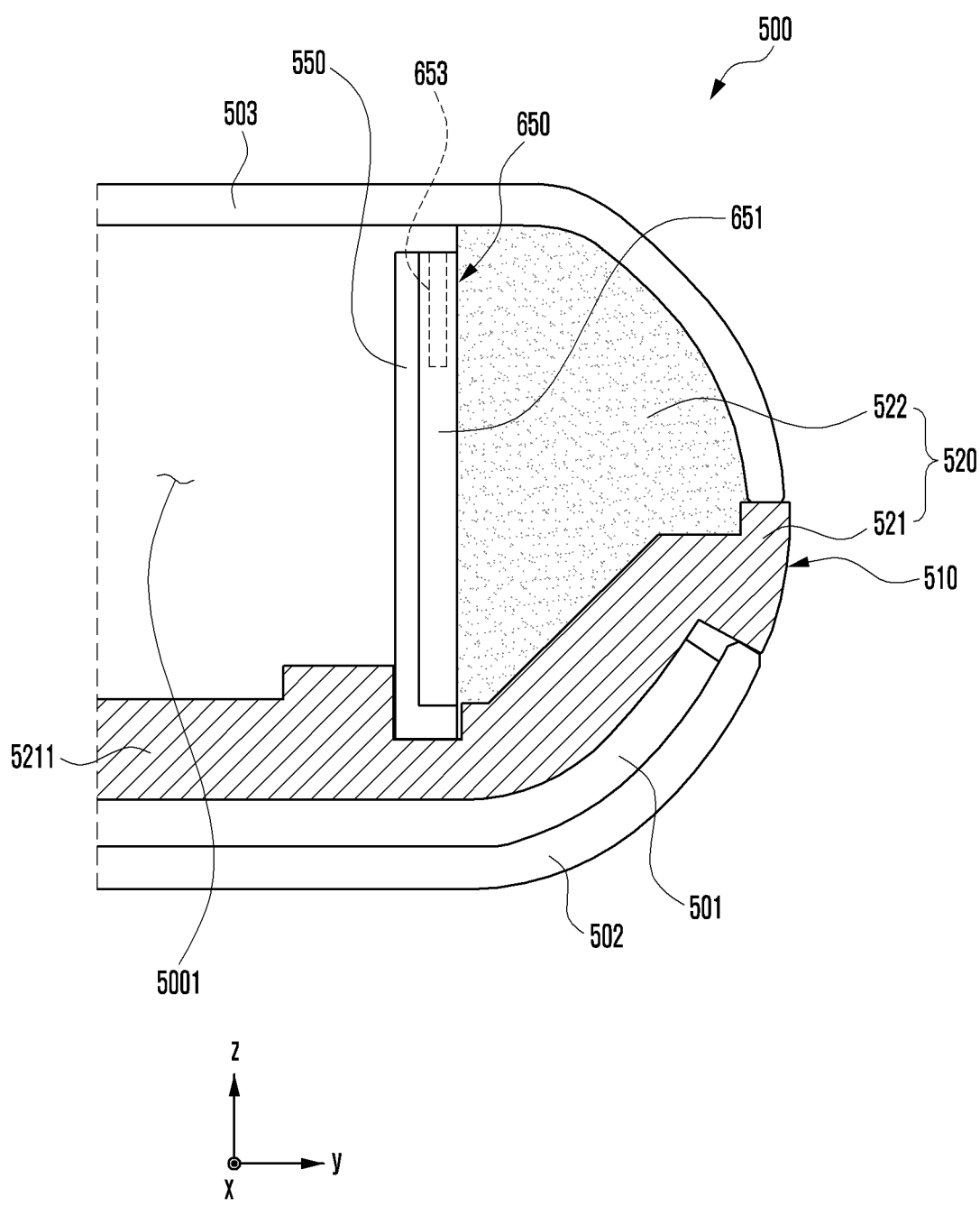
FIG. 7 is a cross-sectional view, taken along the line A-A' in FIG. 5, partially illustrating an electronic device according to various embodiments of the disclosure.
Figure 8:
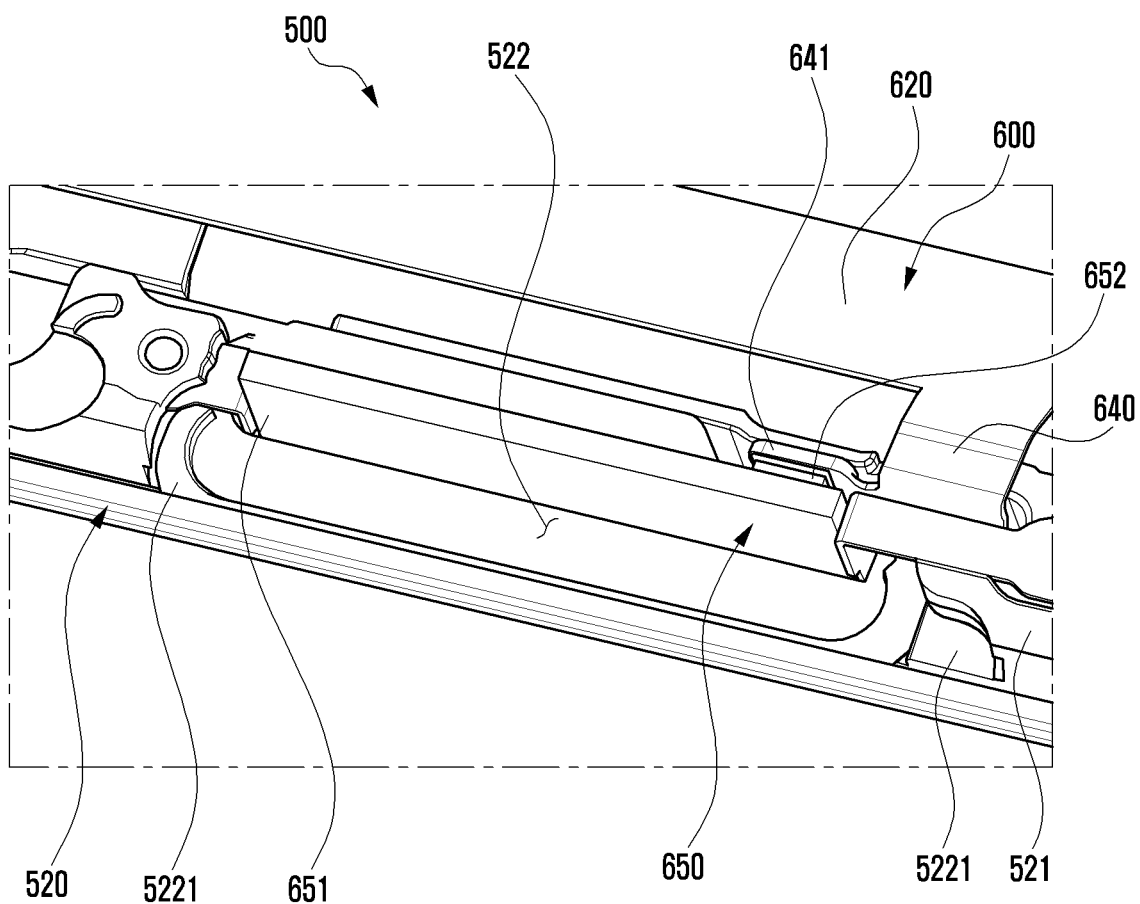
FIG. 8 is an enlarged perspective view illustrating the region B in FIG. 5.

FIG. 7 is a cross-sectional view, taken along the line A-A' in FIG. 5, partially illustrating an electronic device 500 according to various embodiments of the disclosure. FIG. 8 is an enlarged perspective view illustrating the region B in FIG. 5.

Referring to FIGS. 7 and 8, the electronic device 500 may include a housing 510 that includes a front cover 502 (e.g., the front plate 302 in FIG. 3C) facing a first direction (e.g., the negative z-axis direction), a rear cover 503 (e.g., the rear plate 311 in FIG. 3C) facing a direction (e.g., the z-axis direction) opposite to the front cover 502, and a lateral member 520 (e.g., the lateral member 320 in FIG. 3C) surrounding an inner space 5001 between the front cover 502 and the rear cover 503. According to an embodiment, the lateral member 520 may include a conductive member 521 (e.g., metal) disposed at least in part and a non-conductive member 522 (e.g., polymer) combined with the conductive member 521. In another embodiment, the non-conductive member 522 may be replaced with a space or any other dielectric material. In still another embodiment, the non-conductive member 522 may be insert-injected into the conductive member 521. In yet another embodiment, the non-conductive member 522 may be structurally combined with the conductive member 521. According to an embodiment, the lateral member 520 may include a support member 5211 (e.g., the first support member 3211 in FIG. 3C), as a support means, extended partially into the inner space 5001. According to an embodiment, the support member 5211 may be extended from the lateral member 520 into the inner space 5001 or formed by a structural combination with the lateral member 520. According to an embodiment, the support member 5211 may be extended from the conductive member 521 and/or the non-conductive member 522. According to an embodiment, the support member 5211 may support at least a part of the second antenna structure 650 disposed in the inner space 5001. According to an embodiment, the support member 5211 may be disposed to support at least a part of a display 501 (e.g., the display 301 in FIG. 3C). According to an embodiment, the display 501 may include a flexible display.

According to various embodiments, the second antenna structure 650 may be disposed in a direction perpendicular to the front cover 502 in the inner space 5001 of the electronic device 500 through a conductive support bracket 550 as a conductive support means. According to an embodiment, the second antenna structure 650 may be mounted such that the at least one first antenna element 653 faces the lateral member 520. In another embodiment, the second antenna structure 650 may be disposed such that the at least one first antenna element 653 faces the rear cover 503 or the front cover 502.

According to various embodiments, because the lateral member 520 includes the non-conductive member 522 disposed in an area facing the second antenna structure 650, it is possible to prevent the radiation performance of the second antenna structure 650 from being lowered due to the interference of the conductive member 521 in the vicinity. For example, in case where the at least one first antenna element 653 of the second antenna structure 650 radiates a millimeter wave, the second non-conductive member 522 may be disposed, when the lateral member 520 is viewed from the outside, in an area overlapped with the second antenna structure 650 and in an extended area 5221 extended from both ends of the overlapped area.

Figure 9:
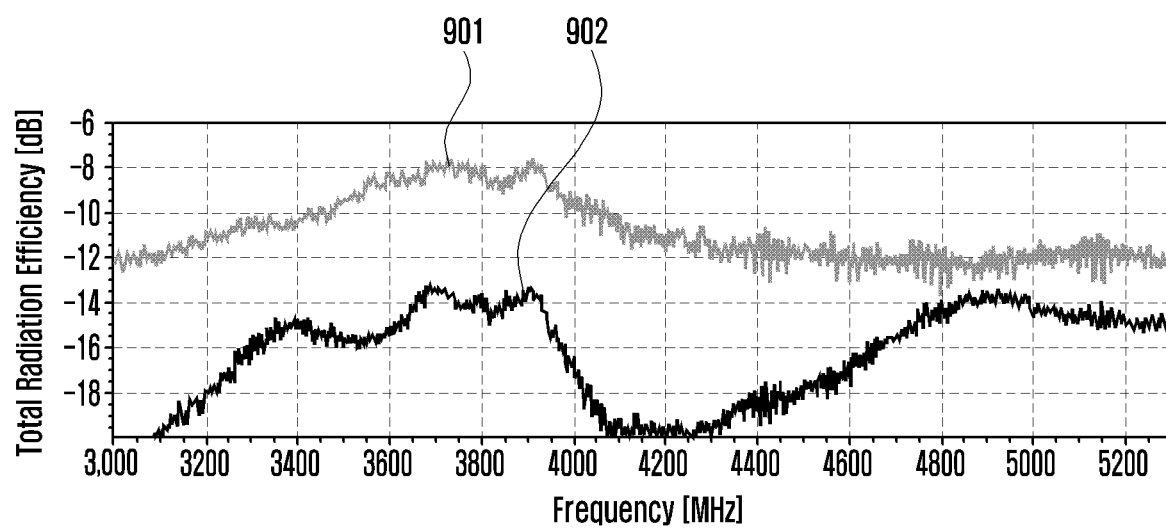
FIG. 9 is a graph showing the radiation efficiency depending on positions of a second antenna structure according to various embodiments of the disclosure.

FIG. 9 is a graph showing the radiation efficiency depending on positions of a second antenna structure 650 according to various embodiments of the disclosure.

Referring to FIG. 9, in a band of about 3.3 GHz to about 5.0 GHz (e.g., N77 band, N78 band, or N79 band), it can be seen that the radiation efficiency of the second antenna structure 650 is generally better in case (denoted by reference numeral 901) where the second antenna structure 650 is connected to the branch portion 640 of the flexible substrate 600 and thereby spaced apart from the first antenna structure 5111 than in case (denoted by reference numeral 902) where the second antenna structure 650 is disposed near the first antenna structure 5111.

Hereinafter, various embodiments of the flexible substrate 600 will be described. Components that are substantially the same as those described above in the flexible substrate 600 are given the same reference numerals, and detailed descriptions thereof may be omitted.

Figure 10:
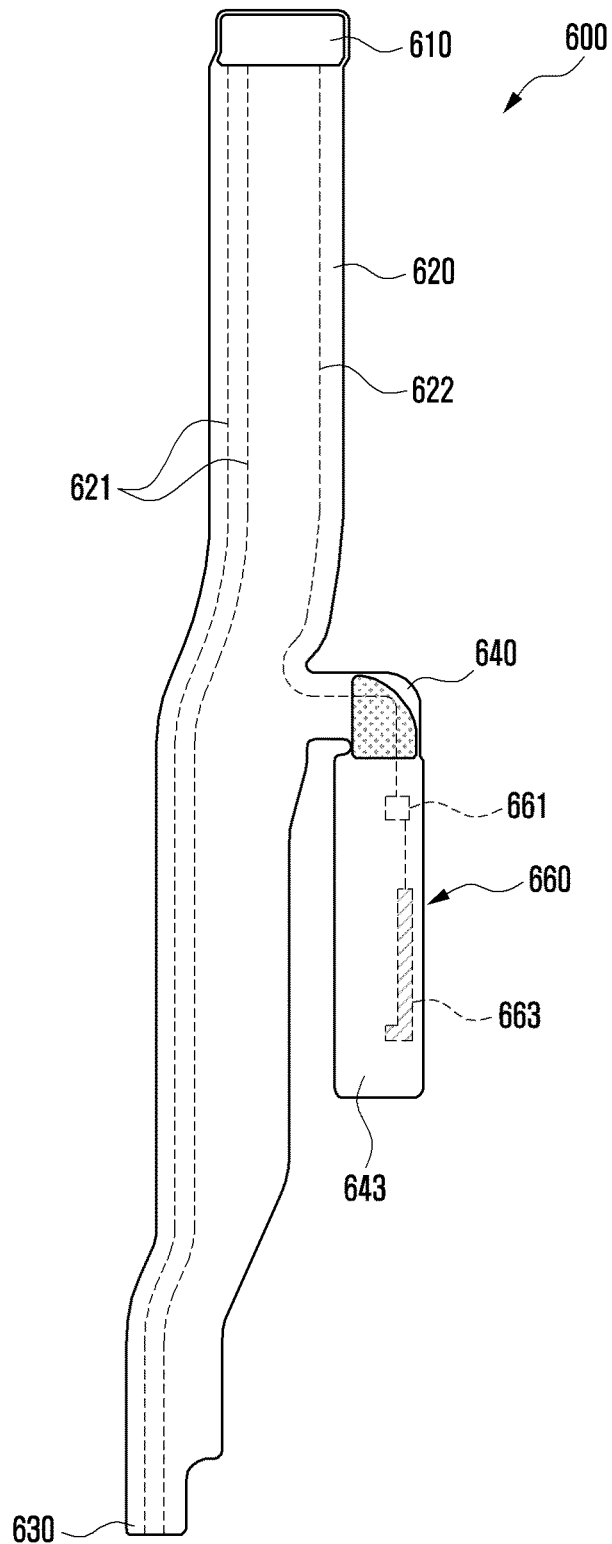
FIG. 10 is a schematic view illustrating a flexible substrate according to various embodiments of the disclosure.

FIG. 10 is a schematic view illustrating a flexible substrate 600 according to various embodiments of the disclosure.

Referring to FIG. 10, the flexible substrate 600 may include the branch portion 640 branched from the interconnecting portion 620. According to an embodiment, in the flexible substrate 600, a second antenna structure 660 may be formed through an extension portion 643 integrally extended from the branch portion 640. According to an embodiment, the second antenna structure 660 may be integrally formed with the branch portion 640 of the flexible substrate 600, and at least one first antenna element 663 may be disposed in the second antenna structure 660. For example, the first antenna element 663 may include a conductive pattern formed simultaneously with the first and second conductive paths 621 and 622 of the flexible substrate 600. In another embodiment, the first antenna element 663 may be a metal plate separately patterned and attached to the extension portion 643, an FPCB having a conductive pattern and attached to the extension portion 643, or a conductive coating material coated on the extension portion 643. According to an embodiment, the second conductive path 622 extended from the first connecting portion 610 to the branch portion 640 along the interconnecting portion 620 may be electrically connected to the first antenna element 663 formed in/on the extension portion 643. According to an embodiment, the second antenna structure 660 may include at least one matching circuit 661, as an impedance matching means, disposed on the second conductive path 622 in the extension portion 643.

In another embodiment, the second antenna structure 660 may be replaced with the conductive portion formed at least partially in the second lateral surface (e.g., the second lateral surface 512 in FIG. 5) of the lateral member (e.g., the lateral member 520 in FIG. 5). In this case, the flexible substrate 600 may have configuration that a conductive terminal formed on the extension portion 643 extended from the branch portion 640 is electrically and physically connected to the conductive portion of the second lateral surface 512 through an electrical connection means (e.g., a conductive C-clip).

Figure 11A:
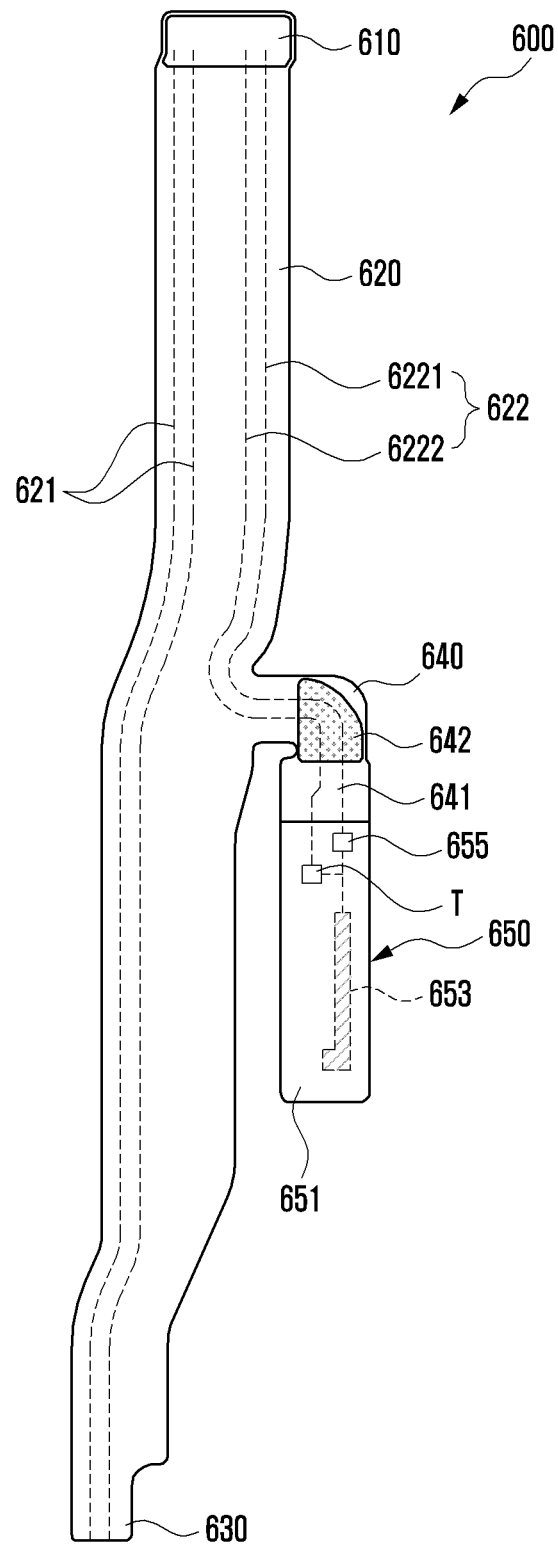
FIG. 11A is a schematic view illustrating a flexible substrate according to various embodiments of the disclosure.
Figure 11B:
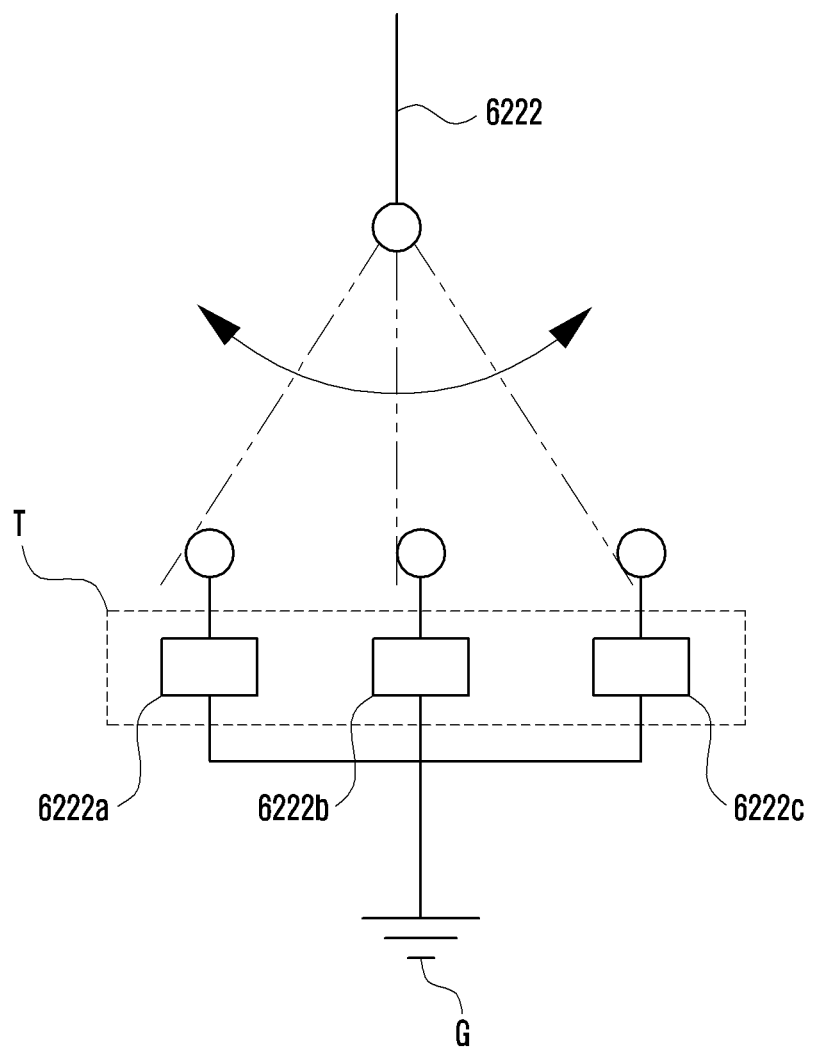
FIG. 11B is a schematic view illustrating a configuration of the tunable circuit, shown in FIG. 11A, according to various embodiments of the disclosure.

FIG. 11A is a schematic view illustrating a flexible substrate 600 according to various embodiments of the disclosure. FIG. 11B is a schematic view illustrating a configuration of the tunable circuit T, shown in FIG. 11A, according to various embodiments of the disclosure.

Referring to FIG. 11A, the flexible substrate 600 may include the branch portion 640 branched from the interconnecting portion 620. According to an embodiment, the flexible substrate 600 may include the second antenna structure 650 detachably connected to the branch portion 640. According to an embodiment, the second antenna structure 650 may have substantially the same electrical connection structure as that of the second antenna structure 650 of FIG. 6A.

According to various embodiments, the second antenna structure 650 may include a tunable circuit T (e.g., a tunable IC), as a frequency shifting means, electrically connected to the first antenna element 653. According to an embodiment, the flexible substrate 600 may include the at least one second conductive path 622 extended from the first connecting portion 610 to the branch portion 640 along the interconnecting portion 620. According to an embodiment, the at least one second conductive path 622 may include a signal line 6221 extended from the first connecting portion 610 to the at least one first antenna element 653, and a control line 6222 extended from the first connecting portion 610 to the tunable circuit T. Therefore, the at least one processor (e.g., the processor 120 in FIG. 1) mounted on the first PCB (e.g., the first PCB 531 in FIG. 5) may control the tunable circuit T through the control line 6222 of the flexible substrate 600. According to an embodiment, the processor (e.g., the processor 120 in FIG. 1) may shift the operating frequency band of the second antenna structure 650 by a switching operation through the tunable circuit T. In another embodiment, the tunable circuit T and/or the matching circuit 655 may be mounted on the second conductive path 622 in at least a part of the branch portion 640.

Referring to FIG. 11B, as a frequency shifting means, the tunable circuit T may include a plurality of lumped elements 6222a, 6222b, and 6222c that can be connected to the first antenna element (e.g., the first antenna element 653 in FIG. 11A) through the control line 6222 of the second conductive path 622. According to an embodiment, the processor (e.g., the processor 120 in FIG. 1) of the electronic device 500 may detect an environment (or condition) of the electronic device and control the tunable circuit T to satisfy the detected condition, thereby controlling the second antenna structure 650 to operate in a specific frequency band. For example, the tunable circuit T may include the plurality of lumped elements 6222a, 6222b, and 6222c arranged to be connected to the ground G in a parallel arrangement structure (e.g., a shunt structure). In another embodiment, the tunable circuit T may include the plurality of lumped elements 6222a, 6222b, and 6222c having a series arrangement. According to an embodiment, the plurality of lumped elements 6222a, 6222b, and 6222c may include passive elements such as R, L, or C.

Figure 12:
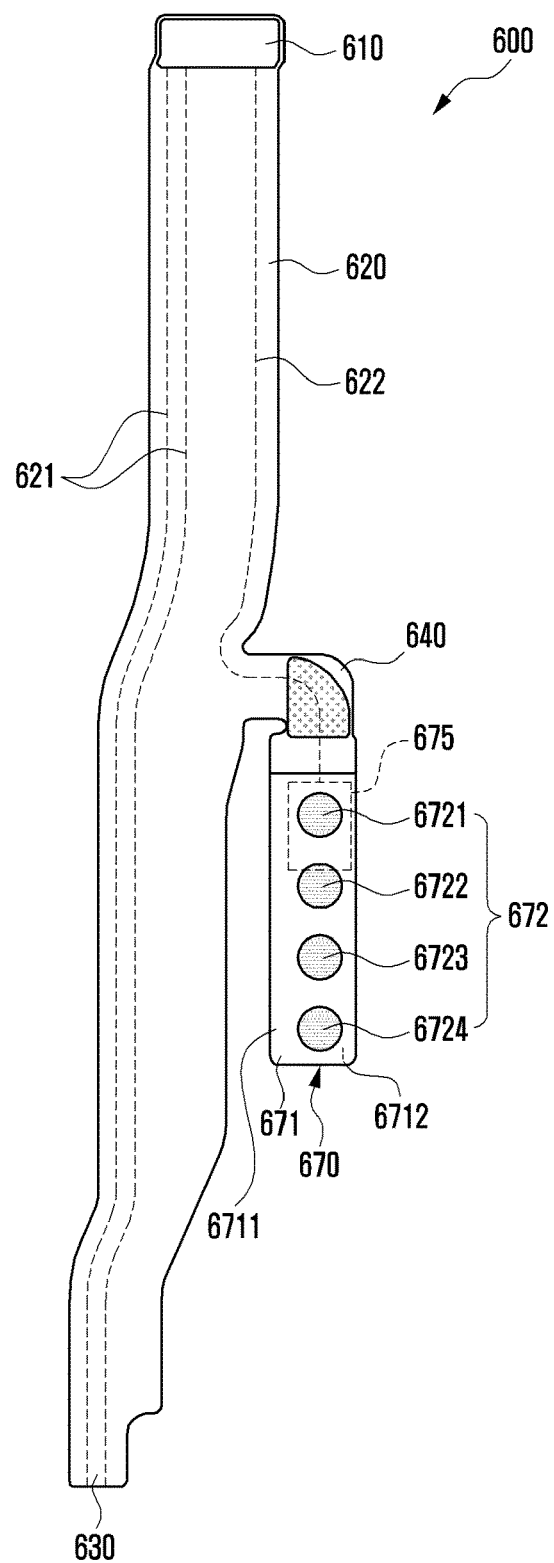
FIG. 12 is a schematic view illustrating a flexible substrate according to various embodiments of the disclosure.
Figure 13:
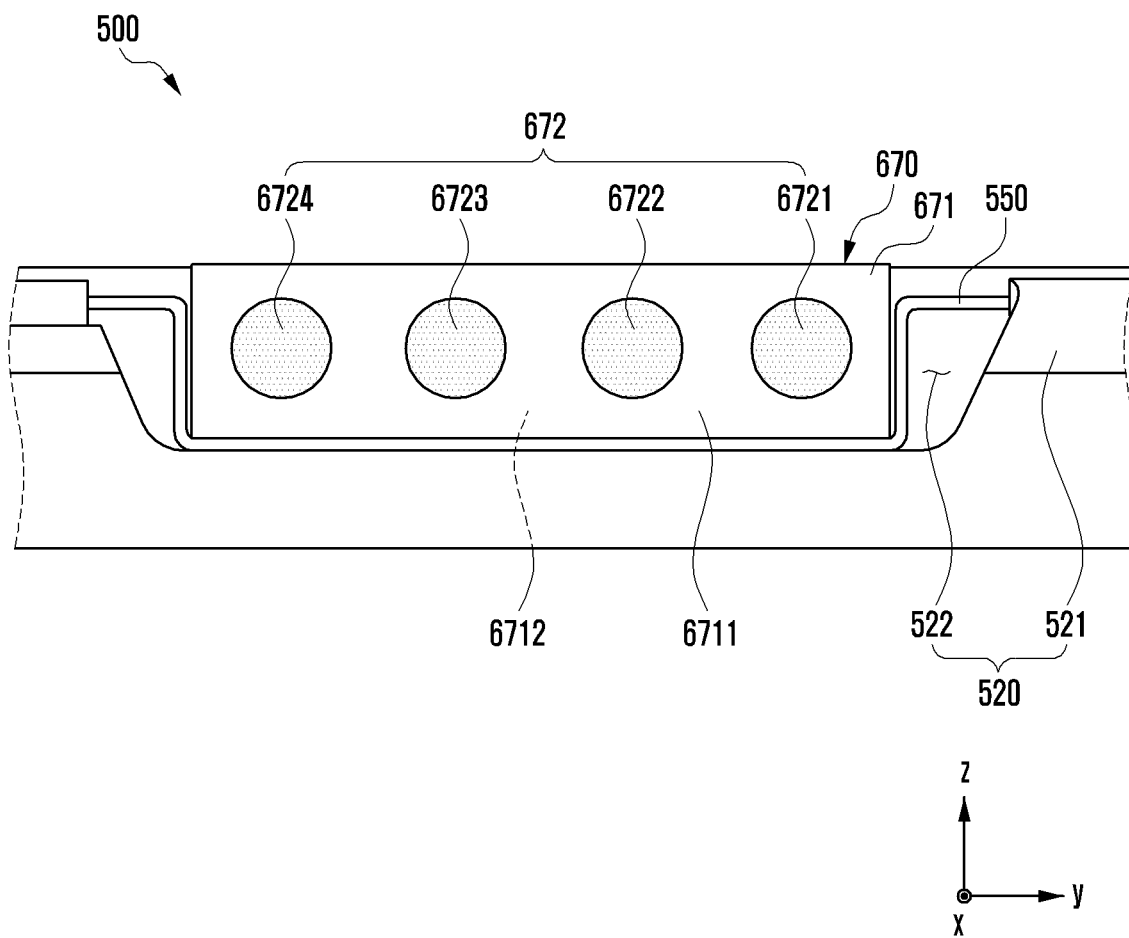
FIG. 13 is a side view partially illustrating an electronic device, in which the second antenna structure shown in FIG. 12 is disposed, according to various embodiments of the disclosure.

FIG. 12 is a schematic view illustrating a flexible substrate 600 according to various embodiments of the disclosure. FIG. 13 is a side view partially illustrating an electronic device 500, in which the second antenna structure 670 shown in FIG. 12 is disposed, according to various embodiments of the disclosure.

Referring to FIG. 12, the flexible substrate 600 may include the branch portion 640 branched from the interconnecting portion 620. According to an embodiment, the flexible substrate 600 may be electrically connected to the second antenna structure 670 detachably connected to the branch portion 640. According to an embodiment, the second antenna structure 670 may have substantially the same electrical connection structure as that of the second antenna structure 650 of FIG. 6A.

According to various embodiments, the second antenna structure 670 may include a dielectric substrate 671 (e.g., a PCB, a carrier of a dielectric material, or a FPCB) that has a first substrate surface (e.g., the first substrate surface 6711 in FIG. 13) and a second substrate surface (e.g., the second substrate surface 6712 in FIG. 13) facing opposite to the first substrate surface 6711. According to an embodiment, the second antenna structure 670 may include at least one first antenna element 672, as a radiation means, exposed to the first substrate surface 6711 of the dielectric substrate 671 or disposed near the first substrate surface 6711 in an inner space of the dielectric substrate 671. According to an embodiment, the at least one first antenna element 672 may include an array antenna that includes a first conductive pattern 6721, a second conductive pattern 6722, a third conductive pattern 6723, and/or a fourth conductive pattern 6724, which are arranged at regular intervals on the dielectric substrate 671. According to an embodiment, at least one wireless communication circuit (e.g., the wireless communication module 192 in FIG. 1) mounted on the first PCB (e.g., the first PCB 531 in FIG. 5) may be configured to transmit and/or receive a radio signal in the range of about 3 GHz to about 300 GHz through the second antenna structure 670 electrically connected through the second conductive path 622 of the flexible substrate 600. In another embodiment, a wireless communication circuit 675 may be mounted on the second substrate surface 6712 of the dielectric substrate 671.

FIG. 13 shows the lateral member 520, when viewed from the outside, on which the second antenna structure 670 of the electronic device 500 is disposed.

According to various embodiments, the dielectric substrate 671 of the second antenna structure 670 may be disposed such that the at least one first antenna element 672 faces the lateral member 520. In this case, the lateral member 520 may include the non-conductive member 522 disposed in an area overlapped with the second antenna structure 670 when viewed from the outside. For example, the second antenna structure 670 may be configured such that the at least one first antenna element 672 forms a beam pattern through the non-conductive member 522 of the lateral member 520 in a direction that the lateral member 520 faces.

Figure 14A:
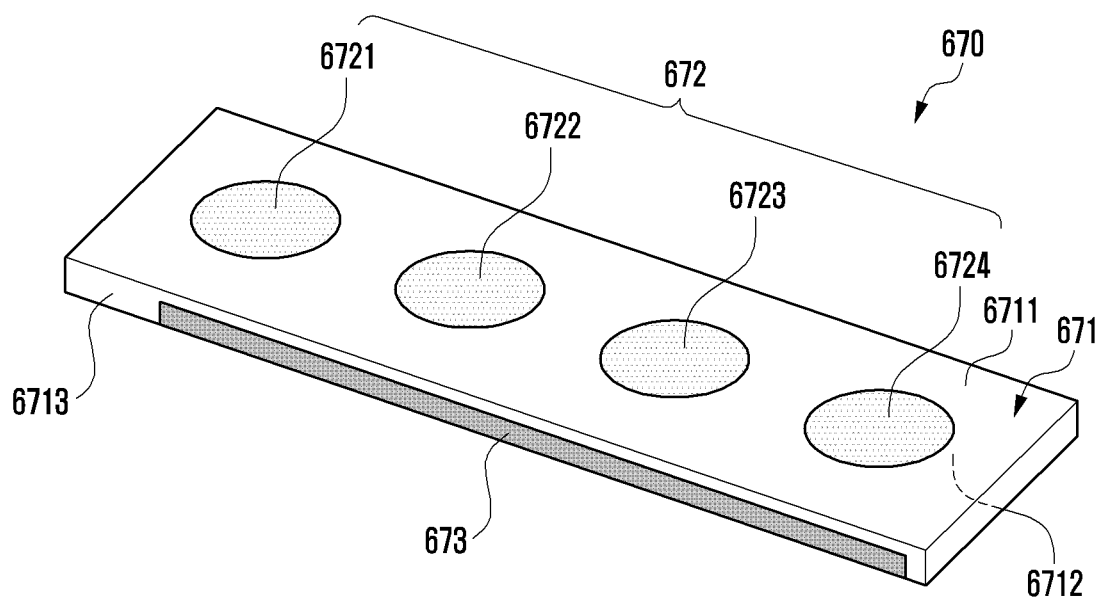
FIGS. 14A to 14C are perspective views illustrating arrangements of a second antenna element on a dielectric substrate according to various embodiments of the disclosure.
Figure 14B:
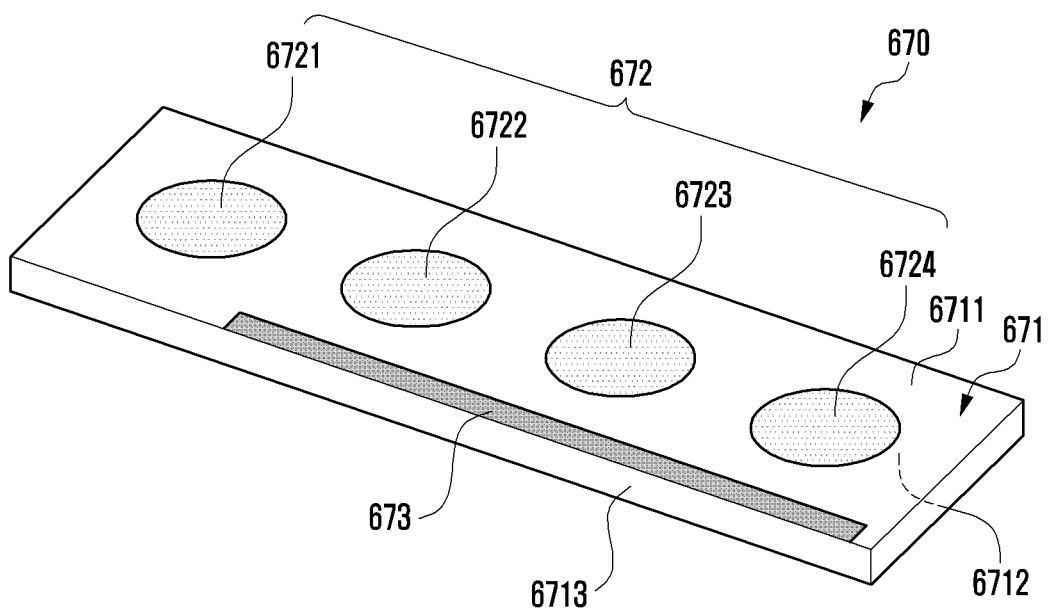
Figure 14C:
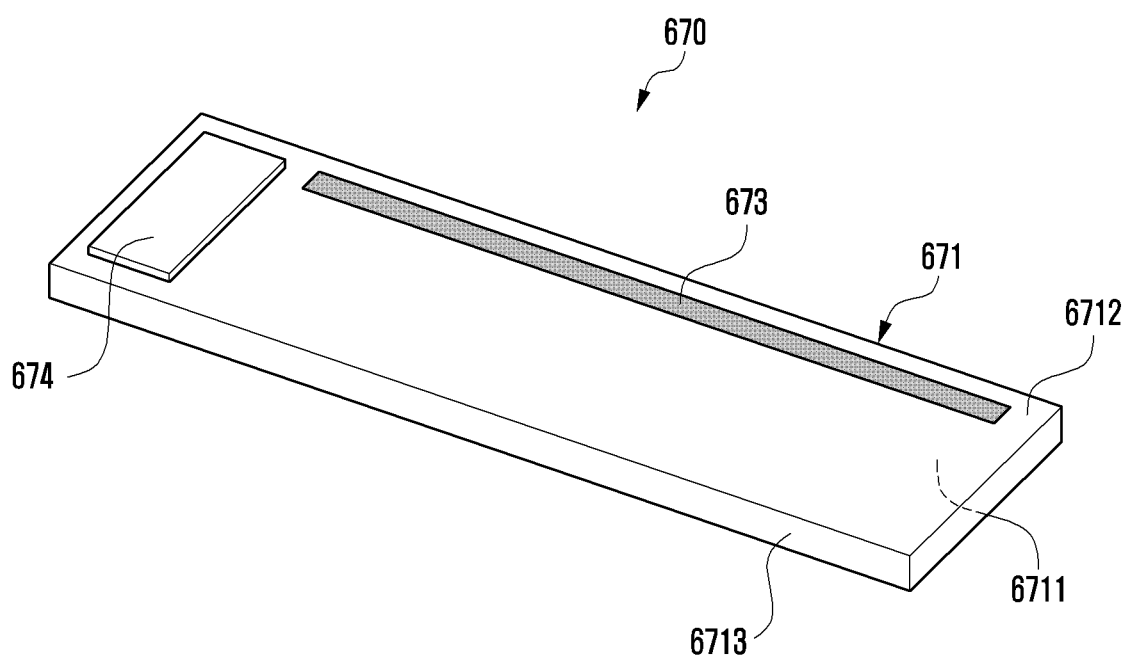

FIGS. 14A to 14C are perspective views illustrating arrangements of a second antenna element 673 on a dielectric substrate 671 according to various embodiments of the disclosure.

At least some of components of the second antenna structure shown in FIGS. 14A to 14C have substantially the same configuration as those of the second antenna structure shown in FIG. 12, so that the same reference numerals will be used and detailed description may be omitted.

Referring to FIG. 14A, the second antenna structure 670 may include the dielectric substrate 671 that has the first substrate surface 6711, the second substrate surface 6712 facing opposite to the first substrate surface 6711, and a substrate lateral surface 6713 surrounding a space between the first and second substrate surfaces 6711 and 6712. According to an embodiment, the second antenna structure 670 may include the at least one first antenna element 672 including a plurality of conductive patterns 6721, 6722, 6723, and 6724, as a first radiation means, exposed to the first substrate surface 6711 or disposed near the first substrate surface 6711 inside the dielectric substrate 671. According to an embodiment, the second antenna structure 670 may include a second antenna element 673, as a second radiation means, disposed in at least a part of the substrate lateral surface 6713. According to an embodiment, at least one wireless communication circuit (e.g., the wireless communication module 192 in FIG. 1) may be configured to transmit and/or receive a radio signal in the range of about 6 GHz to about 300 GHz through the first antenna element 672 of the second antenna structure 670 electrically connected through at least one second conductive path (e.g., the second conductive path 622 in FIG. 12) of a flexible substrate (e.g., the flexible substrate 600 in FIG. 12). According to an embodiment, the at least one wireless communication circuit (e.g., the wireless communication module 192 in FIG. 1) may be configured to transmit and/or receive a radio signal in the range of about 3.3 GHz to about 6.0 GHz through the second antenna element 673 of the second antenna structure 670 electrically connected through the second conductive path 622 of the flexible substrate 600. In an embodiment, although not shown, the second conductive path 622 to which both the first antenna element 672 and the second antenna element 673 are connected may be formed of two or more different ones.

Referring to FIG. 14B, in an embodiment, the second antenna element 673 may be disposed on the first substrate surface 6711.

Referring to FIG. 14C, in an embodiment, the second antenna element 673 may be disposed on the second substrate surface 6712 on which the electrical connector 674 is disposed. In another embodiment, the second antenna element 673 may include at least two conductive patterns disposed respectively on different surfaces (e.g., the first substrate surface 6711, the second substrate surface 6712, and/or the substrate lateral surface 6713) of the dielectric substrate 671.

Figure 15:
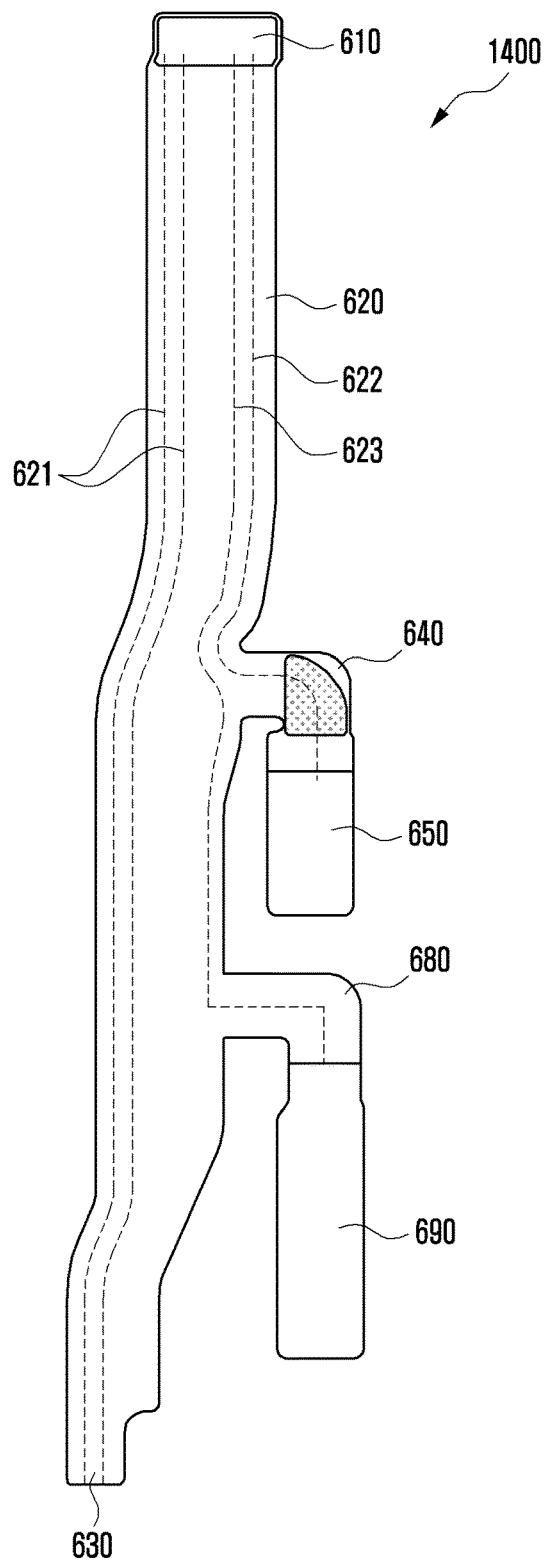
FIG. 15 is a schematic view illustrating a flexible substrate according to various embodiments of the disclosure.

FIG. 15 is a schematic view illustrating a flexible substrate 1400 according to various embodiments of the disclosure.

The flexible substrate 1400 of FIG. 15 may be similar, at least in part, to the flexible substrate 600 of FIG. 5, or may include other embodiments of the flexible substrate.

Referring to FIG. 15, the flexible substrate 1400 may include a first connecting portion 610 electrically connected to a first PCB (e.g., the first PCB 531 in FIG. 5), an interconnecting portion 620 extended from the first connecting portion 610 with a certain length, and a second connecting portion 630 extended from the interconnecting portion 620 and electrically connected to a second PCB (e.g., the second PCB 532 in FIG. 5) connected to at least one first antenna structure (e.g., the first antenna structure 5111 in FIG. 5). According to an embodiment, the second connecting portion 630 may be directly and electrically connected to the at least one first antenna structure 5111.

According to various embodiments, the flexible substrate 1400 may include a first branch portion 640 branched from one part of the interconnecting portion 620, and a second branch portion 680 branched from another part of the interconnecting portion 620. As shown, the first branch portion 640 and the second branch portion 680 may be branched in the same direction from the interconnecting portion 620, but this is exemplary only. Alternatively, the first branch portion 640 and the second branch portion 680 may be branched in opposite directions from the interconnecting portion 620. In another embodiment, the flexible substrate 1400 may include three or more branch portions that are branched from the interconnecting portion 620 in the same and/or different direction(s). According to an embodiment, the flexible substrate 1400 may include a second antenna structure 650 disposed to the first branch portion 640, and a third antenna structure 690 disposed to the second branch portion 680. According to an embodiment, each of the second and third antenna structures 650 and 690 may have substantially the same separation architecture as that of the second antenna structure 650 of FIG. 6A separated from the branch portion 640. In another embodiment, each of the second and third antenna structures 650 and 690 may have substantially the same extension architecture as that of the second antenna structure 660 of FIG. 10 formed through the extension portion 643 extended from the branch portion 640. According to an embodiment, at least one wireless communication circuit (e.g., the wireless communication module 192 in FIG. 1) mounted on a first PCB (e.g., the first PCB 531 in FIG. 5) may be configured to transmit and/or receive a radio signal of a first frequency band through at least one first antenna structure (e.g., the first antenna structure 5111 in FIG. 5) connected to the at least one first conductive path 621 disposed on the flexible substrate 1400. According to an embodiment, the at least one wireless communication circuit (e.g., the wireless communication module 192 in FIG. 1) may be configured to transmit and/or receive a radio signal of a second frequency band through the at least one second antenna structure 650 connected to the at least one second conductive path 622 disposed on the flexible substrate 1400. According to an embodiment, the at least one wireless communication circuit (e.g., the wireless communication module 192 in FIG. 1) may be configured to transmit and/or receive a radio signal of a third frequency band through the at least one third antenna structure 690 connected to the at least one third conductive path 623 disposed on the flexible substrate 1400. According to an embodiment, the first frequency band may include a frequency range of about 800 MHz to about 3300 MHz. According to an embodiment, the second frequency band may include a frequency range of about 3.3 GHz to about 6.0 GHz. According to an embodiment, the third frequency band may include a frequency range of about 6.0 GHz to about 300 GHz.

According to various embodiments, an electronic device (e.g., the electronic device 500 in FIG. 5) may include a housing (e.g., the housing 510 in FIG. 5) having an inner space (e.g., the inner space 5001 in FIG. 5); a printed circuit board (PCB) (e.g., the first PCB 531 in FIG. 5) disposed in the inner space of the housing; a first antenna structure (e.g., the first antenna structure 5111 in FIG. 5) disposed at a position spaced apart from the PCB, and transmitting and/or receiving a radio signal in a first frequency band; at least one second antenna structure (e.g., the second antenna structure 532 in FIG. 5) disposed at a position spaced apart from the PCB, and transmitting and/or receiving a radio signal in a second frequency band different from the first frequency band; and a flexible substrate (e.g., the flexible substrate 600 in FIG. 5) electrically connecting the PCB and the first antenna structure. The flexible substrate may include a first connecting portion (e.g., the first connecting portion 610 in FIG. 5) electrically connected to the PCB; an interconnecting portion (e.g., the interconnecting portion 620 in FIG. 5) extended from the first connecting portion to the first antenna structure; at least one branch portion (e.g., the branch portion 640 in FIG. 5) branched from at least a part of the interconnecting portion, and extended to the at least one second antenna structure; at least one first conductive path (e.g., the first conductive path 621 in FIG. 6A) disposed in the interconnecting portion, and electrically connecting the first connecting portion and the first antenna structure; and at least one second conductive path (e.g., the second conductive path 622 in FIG. 6A) disposed in the interconnecting portion and the at least one branch portion, and electrically connecting the first connecting portion and the at least one second antenna structure.

According to various embodiments, the first frequency band may include a range of 800 MHz to 3300 MHz.

According to various embodiments, the second frequency band may include a range of 3.3 GHz to 300 GHz.

According to various embodiments, the at least one second antenna structure may include an extension portion extended from the branch portion and including at least one conductive pattern (e.g., the antenna element 653 in FIG. 6A).

According to various embodiments, the at least one second antenna structure (e.g., the second antenna structure 650 in FIG. 6B) may include a dielectric substrate (e.g., the dielectric substrate 651 in FIG. 6B) detachably and electrically connected to the branch portion and including a first substrate surface (e.g., the first substrate surface 6511 in FIG. 6B), a second substrate surface (e.g., the second substrate surface 6512 in FIG. 6B) facing opposite to the first substrate surface, and a substrate lateral surface (e.g., the substrate lateral surface 6713 in FIG. 14A) surrounding a space between the first substrate surface and the second substrate surface; and at least one first antenna element (e.g., the first antenna element 653 in FIG. 6B) exposed to the first substrate surface or disposed near the first substrate surface in the space.

According to various embodiments, the at least one second antenna structure may further include an electrical connector (e.g., the electrical connector 652 in FIG. 6B) electrically connected to a receptacle disposed on the branch portion.

According to various embodiments, the at least one first antenna element may include two or more conductive patterns (e.g., the conductive patterns 6721, 6722, 6723, and 6724 in FIG. 14A) arranged at regular intervals on the dielectric substrate.

According to various embodiments, the at least one second antenna structure may further include a second antenna element (e.g., the second antenna element 673 in FIG. 14A) disposed to be spaced apart from the first antenna element on the dielectric substrate and operating in a frequency band different from a frequency band where the first antenna element operates.

According to various embodiments, the second antenna element may be disposed at a position of at least one of at least a part of the first substrate surface, at least a part of the second substrate surface, or at least a part of the substrate lateral surface.

According to various embodiments, the electronic device may further include at least one wireless communication circuit (e.g., the wireless communication module 192 in FIG. 1) mounted on the PCB and configured to transmit and/or receive a radio signal through the first antenna structure and/or the at least one second antenna structure, which are/is electrically connected through the flexible substrate.

According to various embodiments, the at least one second antenna structure may further include at least one impedance matching means (e.g., the matching circuit 655 in FIG. 6B).

According to various embodiments, the housing may include at least in part a lateral member, the lateral member may include a conductive member (e.g., the conductive member 521 in FIG. 7) and a non-conductive member (e.g., the non-conductive member 522 in FIG. 7) combined with each other, and the non-conductive member may be disposed to be overlapped at least in part with the second antenna structure when the lateral member is viewed from outside.

According to various embodiments, the at least one branch portion may include a ground region (e.g., the ground region 642 in FIG. 6A) exposed at least partially, and the ground region may be physically and electrically connected to the conductive member.

According to various embodiments, the electronic device may further include a frequency shifting means (e.g., the tunable circuit T in FIG. 11A) that is disposed, at least in part, in the at least one branch portion or the second antenna structure, and adjusts a frequency band of the second antenna structure.

According to various embodiments, the electronic device may further include at least one processor mounted on the PCB, and the at least one processor may be configured to control the frequency shifting means through a control line (e.g., the control line 6222 in FIG. 11A) included in the at least one second conductive path.

According to various embodiments, the housing may include at least in part a lateral member, the first antenna structure may include at least one conductive portion (e.g., the conductive portion 5111 in FIG. 7) isolated through non-conductive portions (e.g., the non-conductive portions 5112 and 5113 in FIG. 7) spaced apart from each other in a part of the lateral member, and the at least one first conductive path may be electrically connected to the at least one conductive portion.

According to various embodiments, the electronic device may further include a second PCB disposed in the inner space and electrically connected to the at least one conductive portion, and the first conductive path may be electrically connected to the at least one conductive portion through the second PCB.

According to various embodiments, the first antenna structure may include at least one conductive pattern formed on a dielectric structure in the inner space.

According to various embodiments, at least a part of the interconnecting portion may be disposed to be overlapped, at least in part, with at least one other electronic component (e.g., the battery 540 in FIG. 7) in the inner space.

According to various embodiments, the electronic device may further include a display (e.g., the display 501 in FIG. 7) disposed in the inner space to be visible from the outside through at least a part of the housing.

An example 1 of the present disclosure may be device (e.g., the electronic device 500 in FIG. 5) with a housing (e.g., the housing 510 in FIG. 5) having an inner space (e.g., the inner space 5001 in FIG. 5); a printed circuit board (PCB) (e.g., the first PCB 531 in FIG. 5) disposed in the inner space of the housing; a first antenna structure (e.g., the first antenna structure 5111 in FIG. 5) disposed at a position spaced apart from the PCB, and transmitting and/or receiving a radio signal in a first frequency band; at least one second antenna structure (e.g., the second antenna structure 532 in FIG. 5) disposed at a position spaced apart from the PCB, and transmitting and/or receiving a radio signal in a second frequency band different from the first frequency band; and a flexible substrate (e.g., the flexible substrate 600 in FIG. 5) electrically connecting the PCB and the first antenna structure. The flexible substrate may include a first connecting portion (e.g., the first connecting portion 610 in FIG. 5) electrically connected to the PCB; an interconnecting portion (e.g., the interconnecting portion 620 in FIG. 5) extended from the first connecting portion to the first antenna structure; at least one branch portion (e.g., the branch portion 640 in FIG. 5) branched from at least a part of the interconnecting portion, and extended to the at least one second antenna structure; at least one first conductive path (e.g., the first conductive path 621 in FIG. 6A) disposed in the interconnecting portion, and electrically connecting the first connecting portion and the first antenna structure; and at least one second conductive path (e.g., the second conductive path 622 in FIG. 6A) disposed in the interconnecting portion and the at least one branch portion, and electrically connecting the first connecting portion and the at least one second antenna structure.

An example 2 may be a device in accordance with example 1, or with any other example described herein, wherein the first frequency band may include a range of 800 MHz to 3300 MHz.

An example 3 may be a device in accordance with example 1 or example 2, or with any other example described herein, wherein the third embodiment, the second frequency band may include a range of 3.3 GHz to 300 GHz.

An example 4 may be a device in accordance with any one of examples 1 to 3, or with any other example described herein, wherein the at least one second antenna structure may include an extension portion extended from the branch portion and including at least one conductive pattern.

An example 5 may be a device in accordance with any one of examples 1 to 4, or with any other example described herein, wherein the at least one second antenna structure may include a dielectric substrate detachably and electrically connected to the branch portion and including a first substrate surface, a second substrate surface facing opposite to the first substrate surface, and a substrate lateral surface surrounding a space between the first substrate surface and the second substrate surface; and at least one first antenna element exposed to the first substrate surface or disposed near the first substrate surface in the space.

An example 6 may be a device in accordance with any one of examples 1 to 5, or with any other example described herein, wherein the at least one first antenna element may include two or more conductive patterns arranged at regular intervals on the dielectric substrate.

An example 7 may be a device in accordance with any one of examples 1 to 6, or with any other example described herein, wherein the at least one second antenna structure may further include a second antenna element disposed to be spaced apart from the first antenna element on the dielectric substrate and operating in a frequency band different from a frequency band where the first antenna element operates.

An example 8 may be a device in accordance with any one of examples 1 to 7, or with any other example described herein, wherein the second antenna element may be disposed at a position of at least one of at least a part of the first substrate surface, at least a part of the second substrate surface, or at least a part of the substrate lateral surface.

An example 9 may be a device in accordance with any one of examples 1 to 8, or with any other example described herein, wherein the device may further include at least one wireless communication circuit mounted on the PCB and configured to transmit and/or receive a radio signal through the first antenna structure and/or the at least one second antenna structure, which are/is electrically connected through the flexible substrate.

An example 10 may be a device in accordance with any one of examples 1 to 9, or with any other example described herein, wherein the second antenna structure may further include at least one impedance matching means.

An example 11 may be a device in accordance with any one of examples 1 to 10, or with any other example described herein, wherein the housing may include at least in part a lateral member, the lateral member may include a conductive member and a non-conductive member combined with each other, and the non-conductive member may be disposed to be overlapped at least in part with the second antenna structure when the lateral member is viewed from outside.

An example 12 may be a device in accordance with any one of examples 1 to 11, or with any other example described herein, wherein the at least one branch portion may include a ground region exposed at least partially, and the ground region may be physically and electrically connected to the conductive member.

An example 13 may be a device in accordance with any one of examples 1 to 12, or with any other example described herein, wherein the device may further include a frequency shifting means that is disposed, at least in part, in the at least one branch portion or the second antenna structure, and adjusts a frequency band of the second antenna structure.

An example 14 may be a device in accordance with any one of examples 1 to 13, or with any other example described herein, wherein the device may further include at least one processor mounted on the PCB, and the at least one processor may be configured to control the frequency shifting means through a control line included in the at least one second conductive path.

An example 15 may be a device in accordance with any one of examples 1 to 14, or with any other example described herein, wherein the housing may include at least in part a lateral member, the first antenna structure may include at least one conductive portion isolated through non-conductive portions spaced apart from each other in a part of the lateral member, and the at least one first conductive path may be electrically connected to the at least one conductive portion.

The scope of protection is defined by the appended independent claims. Further features are specified by the appended dependent claims. Example implementations can be realized comprising one or more features of any claim taken jointly and severally in any and all permutations.

The examples described in this disclosure include non-limiting example implementations of components corresponding to one or more features specified by the appended independent claims and these features (or their corresponding components) either individually or in combination may contribute to ameliorating one or more technical problems deducible by the skilled person from this disclosure.

Furthermore, one or more selected component of any one example described in this disclosure may be combined with one or more selected component of any other one or more example described in this disclosure, or alternatively may be combined with features of an appended independent claim to form a further alternative example.

Further example implementations can be realized comprising one or more components of any herein described implementation taken jointly and severally in any and all permutations. Yet further example implementations may also be realized by combining features of one or more of the appended claims with one or more selected components of any example implementation described herein.

In forming such further example implementations, some components of any example implementation described in this disclosure may be omitted. The one or more components that may be omitted are those components that the skilled person would directly and unambiguously recognize as being not, as such, indispensable for the function of the present technique in the light of a technical problem discernible from this disclosure. The skilled person would recognize that replacement or removal of such an omitted components does not require modification of other components or features of the further alternative example to compensate for the change. Thus further example implementations may be included, according to the present technique, even if the selected combination of features and/or components is not specifically recited in this disclosure.

Two or more physically distinct components in any described example implementation of this disclosure may alternatively be integrated into a single component where possible, provided that the same function is performed by the single component thus formed. Conversely, a single component of any example implementation described in this disclosure may alternatively be implemented as two or more distinct components to achieve the same function, where appropriate.

What is claimed is:

1. An electronic device comprising:
   a housing;
   a first printed circuit board (PCB) disposed in the housing;
   a first antenna structure disposed at a position spaced apart from the first PCB in the housing, the first antenna being configured to transmit or receive a radio signal in a first frequency band;
   a flexible substrate electrically connecting the first PCB and the first antenna structure;
   a branch portion branched from the flexible substrate; and
   a second antenna structure disposed at a position spaced apart from the first antenna structure in the housing, the second antenna structure being configured to transmit or receive a radio signal in a second frequency band different from the first frequency band,
   wherein the second antenna structure is electrically connected to the first PCB through the branch portion of the flexible substrate.

2. The electronic device of claim 1, wherein the flexible substrate comprises:
   a first connecting portion electrically connected to the first PCB; and
   an interconnecting portion extended from the first connecting portion to the first antenna structure,
   wherein the branch portion is branched from at least a part of the interconnecting portion.

3. The electronic device of claim 2, wherein the flexible substrate further comprises;
   at least one first conductive path disposed in the interconnecting portion, and electrically connecting the first connecting portion and the first antenna structure; and
   at least one second conductive path disposed in the interconnecting portion and the branch portion, and electrically connecting the first connecting portion and the second antenna structure.

4. The electronic device of claim 1,
   wherein the second antenna structure comprises a conductive pattern disposed on at least a portion of the branch portion.

5. The electronic device of claim 1,
   wherein the first antenna structure includes a first conductive portion disposed on a first side of the electronic device.

6. The electronic device of claim 5,
   wherein the second antenna structure comprises a second conductive portion disposed on a second side adjacent to the first side of the electronic device.

7. The electronic device of claim 1, further comprising:
   a second PCB disposed in the housing and electrically connected to the first antenna structure,
   wherein the first PCB is electrically connected to the second PCB through the flexible substrate.

8. The electronic device of claim 1, further comprising:
   a wireless communication circuit disposed on the first PCB,
   wherein the wireless communication circuit is electrically connected to the first antenna structure and the second antenna structure through the flexible substrate.

9. The electronic device of claim 1, wherein the second antenna structure includes:
   a dielectric substrate detachably and electrically connected to the branch portion and including:
     a first substrate surface,
     a second substrate surface facing opposite to the first substrate surface, and
     a substrate lateral surface surrounding a space between the first substrate surface and the second substrate surface, and at least one first antenna element disposed on at least one of the first substrate surface, the second substrate surface or the substrate lateral surface.

10. The electronic device of claim 9, wherein the at least one first antenna element includes at least one conductive patterns arranged on the dielectric substrate.

11. The electronic device of claim 10, wherein the second antenna structure further includes at least one second antenna element disposed to be spaced apart from the at least one first antenna element on the dielectric substrate and operating in a frequency band different from a frequency band where the at least one first antenna element operates.

12. The electronic device of claim 1,
wherein the housing comprises:
a front cover,
a rear cover facing a direction opposite to the front cover, and
a lateral member surrounding an inner space between the front cover and the rear cover and formed as a lateral side of the electronic device, and
wherein the second antenna structure is disposed to be supported by the at least a part of the lateral member in the housing.

13. The electronic device of claim 12,
wherein the lateral member includes a conductive member and a non-conductive member combined with each other, and
wherein at least a part of the second antenna structure is disposed to be overlapped at least in a part with the non-conductive member when the lateral member is viewed from outside of the electronic device.

14. The electronic device of claim 1, further comprising a tunable circuit disposed, at least in part, in the branch portion or the second antenna structure.

15. The electronic device of claim 14, further comprising a processor disposed at the first PCB,
wherein the processor is configured to control the tunable circuit through a control line connecting the first PCB with the second antenna structure on the flexible substrate.

16. The electronic device of claim 1, wherein the first frequency band includes a range of 800 MHz to 3300 MHz.

17. The electronic device of claim 1, wherein the second frequency band includes a range of 3.3 GHz to 6 GHz.

18. The electronic device of claim 1, further comprising a display disposed in the housing to be visible from outside of the electronic device through at least a part of the housing.

19. An electronic device comprising:
a housing;
a printed circuit board (PCB) disposed in the housing;
a first antenna structure disposed at a position spaced apart from the PCB in the housing,
a flexible substrate electrically connecting the PCB with the first antenna structure;
a branch portion branched from the flexible substrate;
a second antenna structure disposed at a position spaced apart from the first antenna structure and the PCB in the housing; and
a wireless communication circuit is electrically connected to the first antenna structure and the second antenna structure through the flexible substrate and disposed on the PCB,
wherein the second antenna structure is electrically connected to the PCB through the branch portion of the flexible substrate, and
wherein the first antenna structure includes a first conductive portion disposed on a first side of the electronic device.

20. The electronic device of claim 19,
wherein the second antenna structure comprises a second conductive portion disposed on a second side adjacent to the first side of the electronic device.

* * * * *